US008928149B2

(12) United States Patent
Chen

(10) Patent No.: US 8,928,149 B2
(45) Date of Patent: Jan. 6, 2015

(54) INTERLAYER CONDUCTOR AND METHOD FOR FORMING

(71) Applicant: Macronix International Co., Ltd., Hsinchu (TW)

(72) Inventor: Shih-Hung Chen, Jhudong Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/867,905

(22) Filed: Apr. 22, 2013

(65) Prior Publication Data

US 2014/0264925 A1 Sep. 18, 2014

Related U.S. Application Data

(60) Provisional application No. 61/776,906, filed on Mar. 12, 2013.

(51) Int. Cl.
| H01L 23/48 | (2006.01) |
| H01L 23/535 | (2006.01) |
| H01L 21/768 | (2006.01) |
| H01L 27/115 | (2006.01) |

(52) U.S. Cl.
CPC ........ *H01L 23/535* (2013.01); *H01L 21/76886* (2013.01); *H01L 27/11548* (2013.01); *H01L 27/11575* (2013.01); *H01L 27/11556* (2013.01); *H01L 27/11582* (2013.01)
USPC ............ 257/774; 257/773; 257/734; 257/736

(58) Field of Classification Search
USPC .................. 257/734, 736, 774, 773
See application file for complete search history.

(56) References Cited

U.S. PATENT DOCUMENTS

| 8,154,128 B2 | 4/2012 | Lung |
| 8,383,512 B2 | 2/2013 | Chen et al. |
| 8,503,213 B2 | 8/2013 | Chen et al. |
| 8,541,882 B2 | 9/2013 | Chen et al. |
| 2012/0182806 A1 | 7/2012 | Chen et al. |
| 2012/0182808 A1 | 7/2012 | Lue et al. |
| 2012/0184097 A1 | 7/2012 | Chen et al. |
| 2013/0161835 A1 | 6/2013 | Chen et al. |

OTHER PUBLICATIONS

U.S. Appl. No. 13/735,922 entitled "Method for Forming Interlayer Connectors to a Stack of Conductive Layers" filed Jan. 7, 2013, 43 pp.
U.S. Appl. No. 13/451,428 entitled "Integrated Circuit Capacitor and Method" filed Apr. 19, 2012, 35 pp.
U.S. Appl. No. 13/736,104, filed Jan. 8, 2013 entitled "3D Stacking Semiconductor Device and Manufacturing Method Thereof," 45 pp.

*Primary Examiner* — Long Pham
(74) *Attorney, Agent, or Firm* — Haynes Beffel & Wolfeld LLP

(57) ABSTRACT

A 3-D structure includes a stack of active layers at different depths has a plurality of contact landing areas on respective active layers within a contact area opening. A plurality of interlayer conductors, each includes a first portion within a contact area opening extending to a contact landing area, and a second portion in part outside the contact area opening above the top active layer. The first portion has a transverse dimension $Y_1$ that is nominally equal to the transverse dimension of the contact area opening, and the second portion having a transverse dimension $Y_2$ that is greater than the transverse dimension of the contact area opening. The active layers can be bit lines or word lines for a 3-D memory device, or other active layers in integrated circuits.

9 Claims, 25 Drawing Sheets

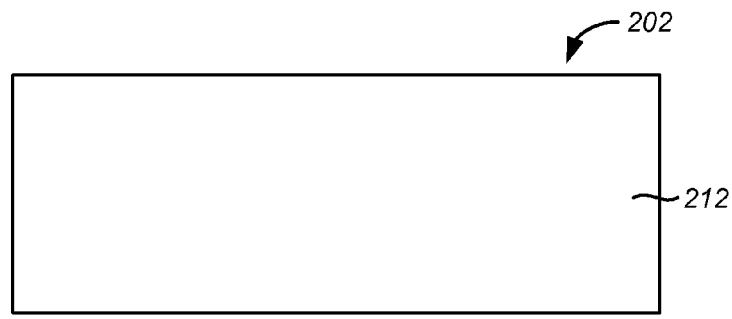
FIG. 2B
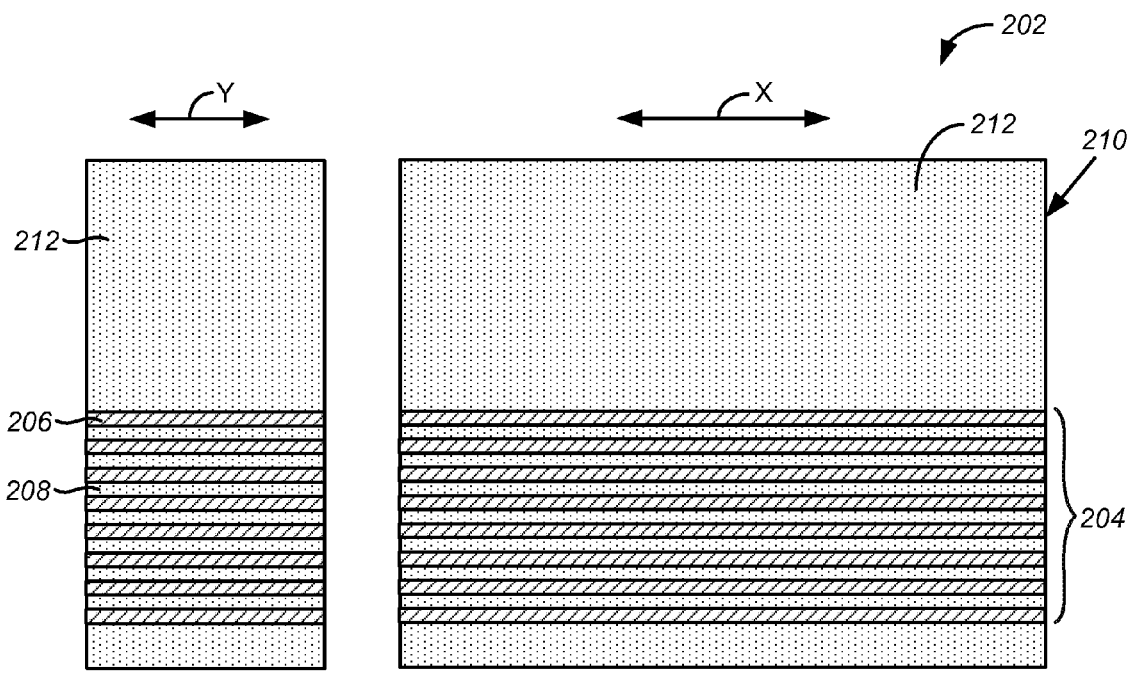
FIG. 2A          FIG. 2

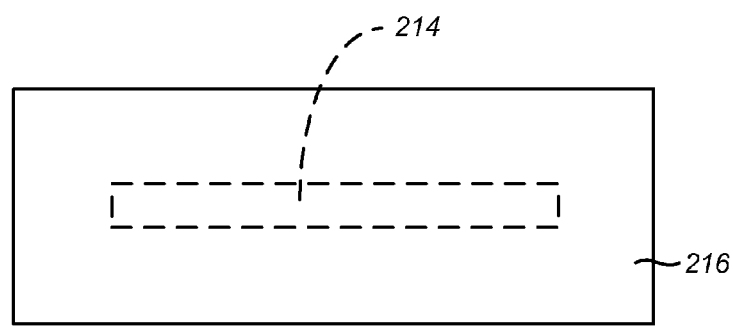
FIG. 4B
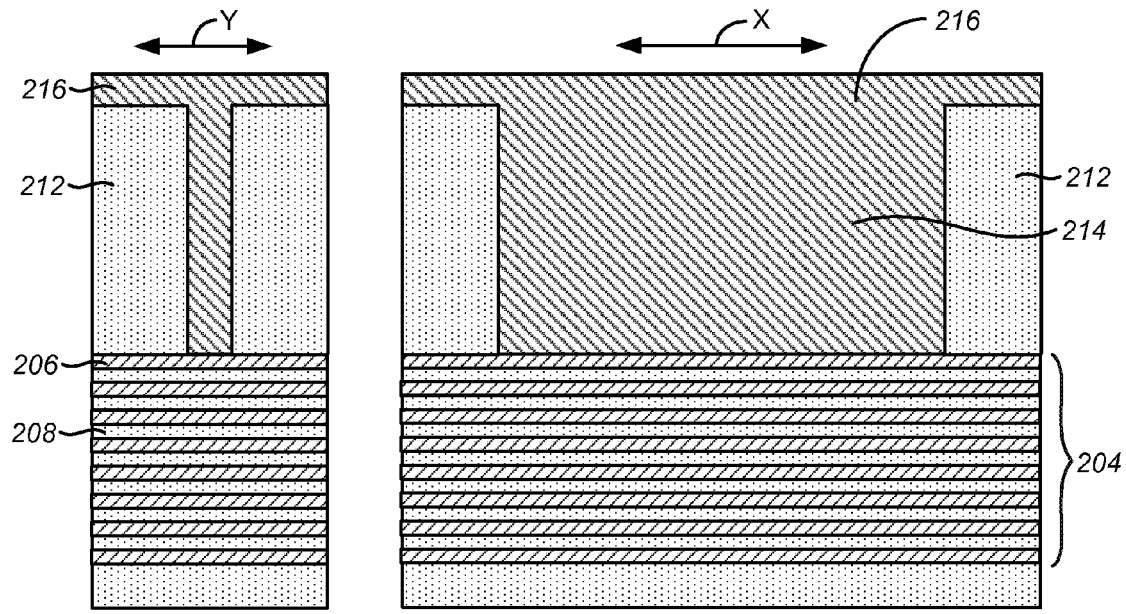
FIG. 4A   FIG. 4

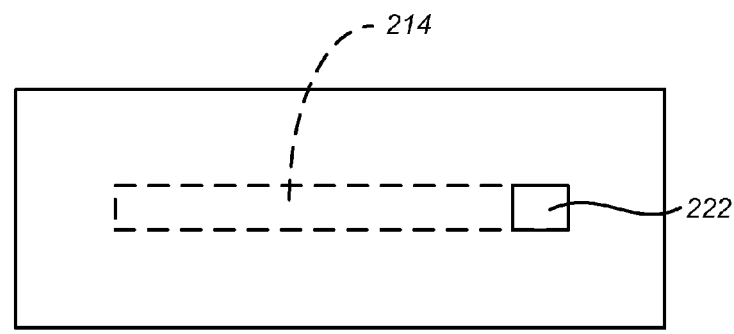
FIG. 5B
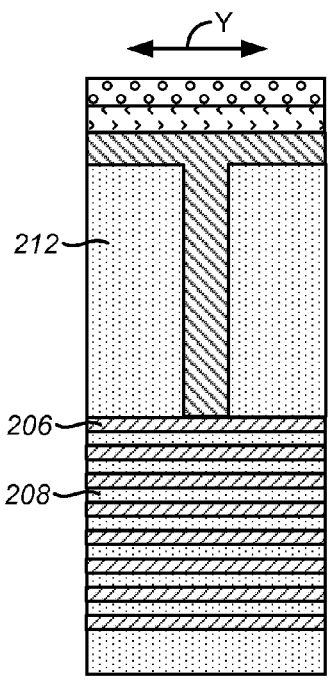
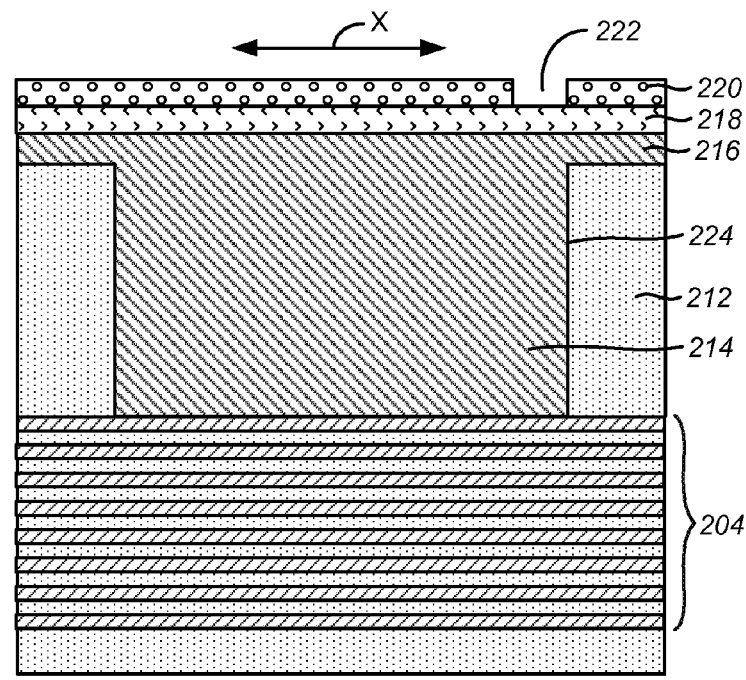
FIG. 5A  FIG. 5

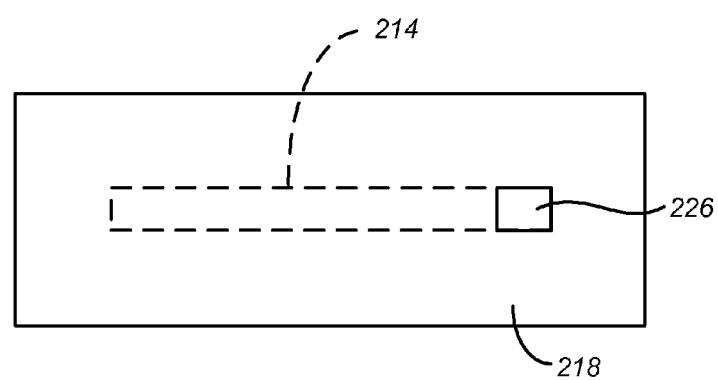
FIG. 6B
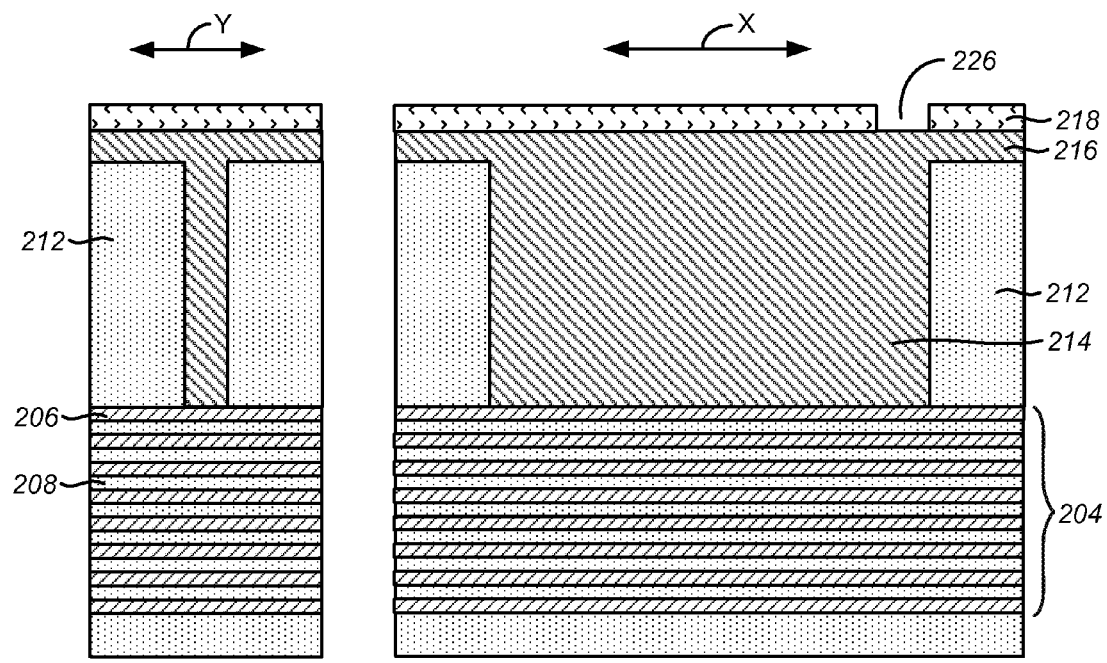
FIG. 6A　　　FIG. 6

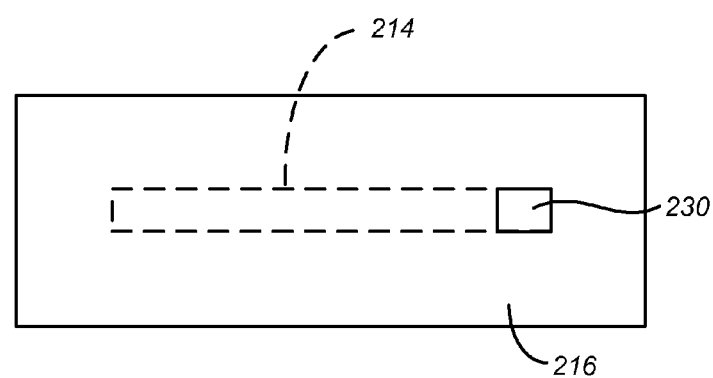
FIG. 8B
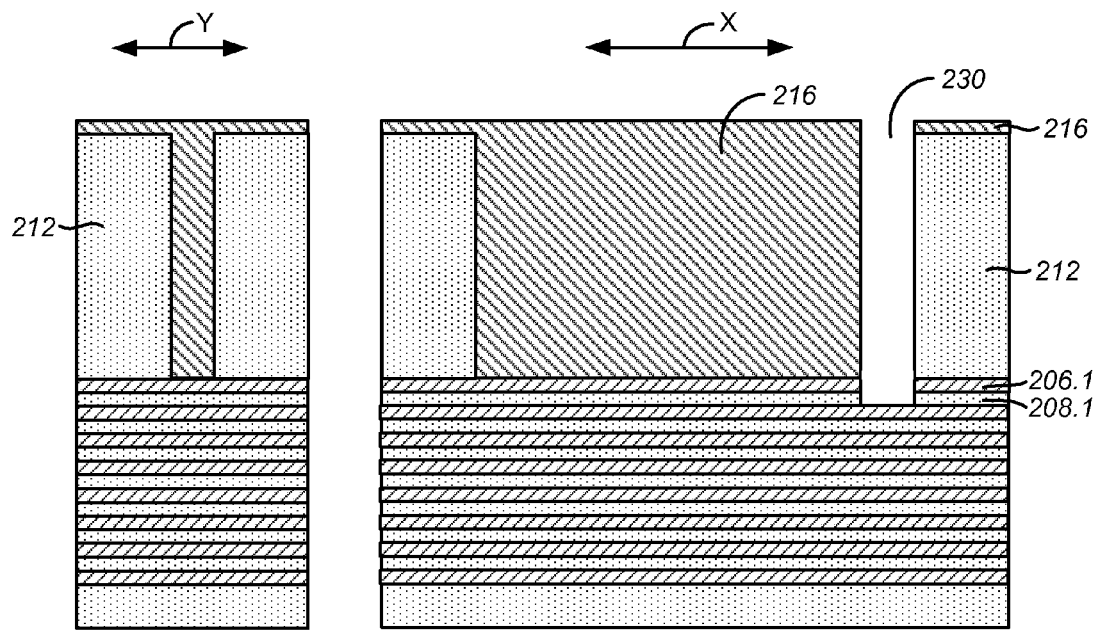
FIG. 8A  FIG. 8

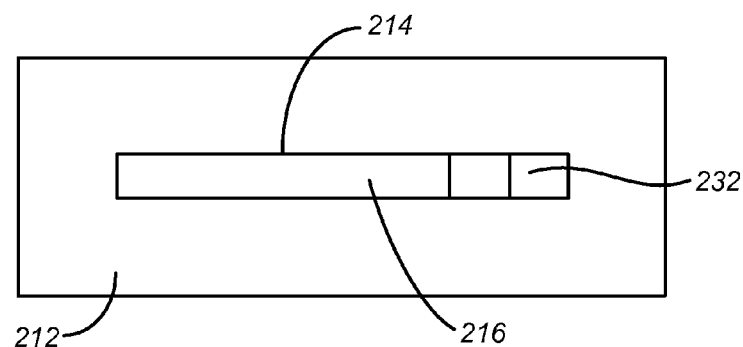
FIG. 10B
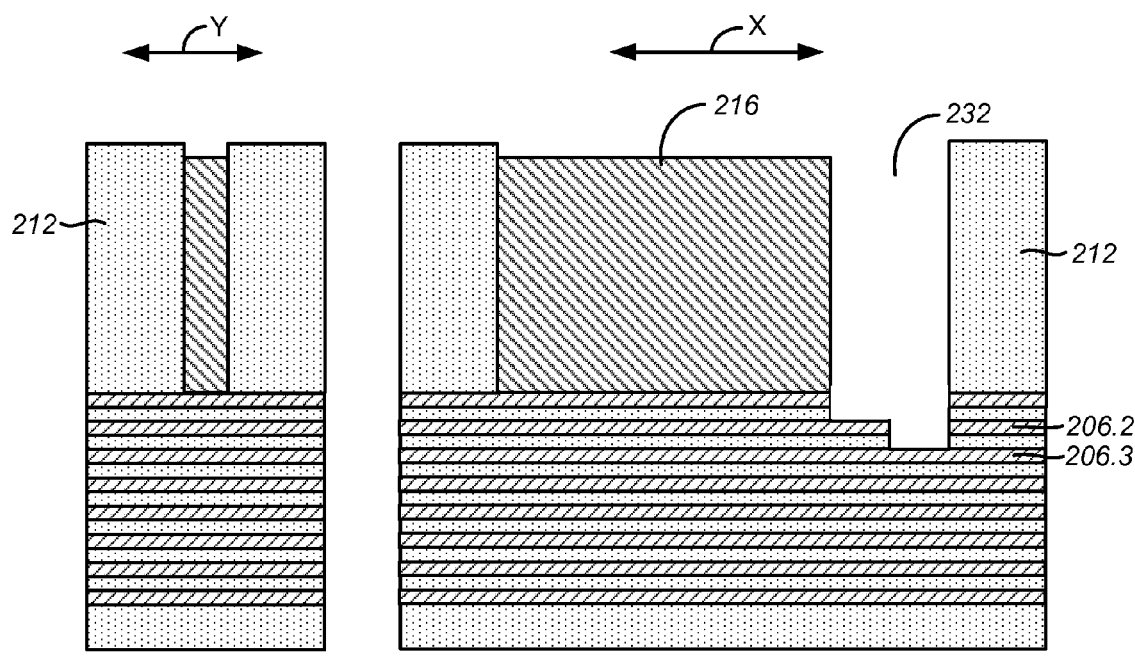
FIG. 10A  FIG. 10

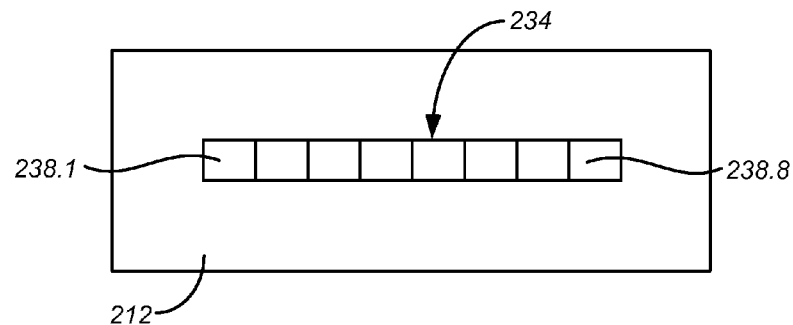
FIG. 11B
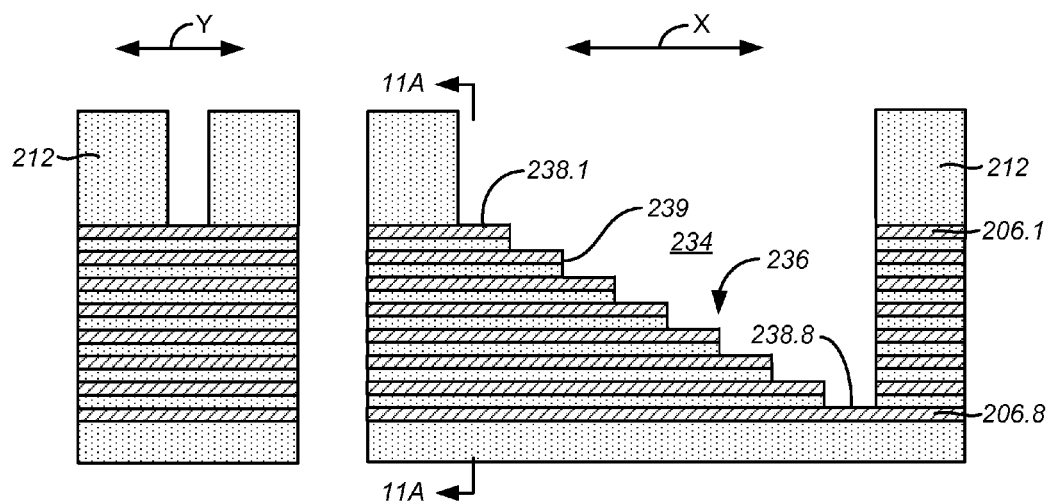
FIG. 11A    FIG. 11

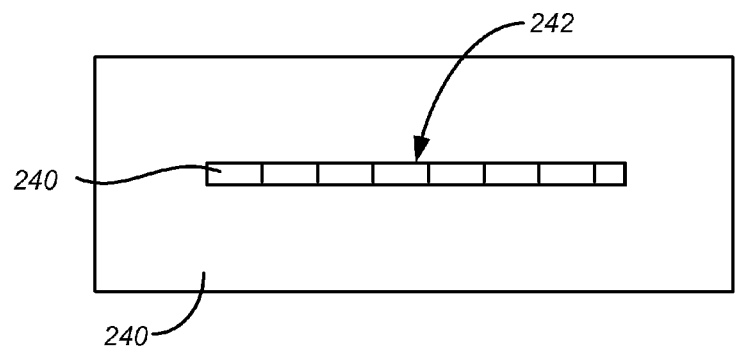
FIG. 12B
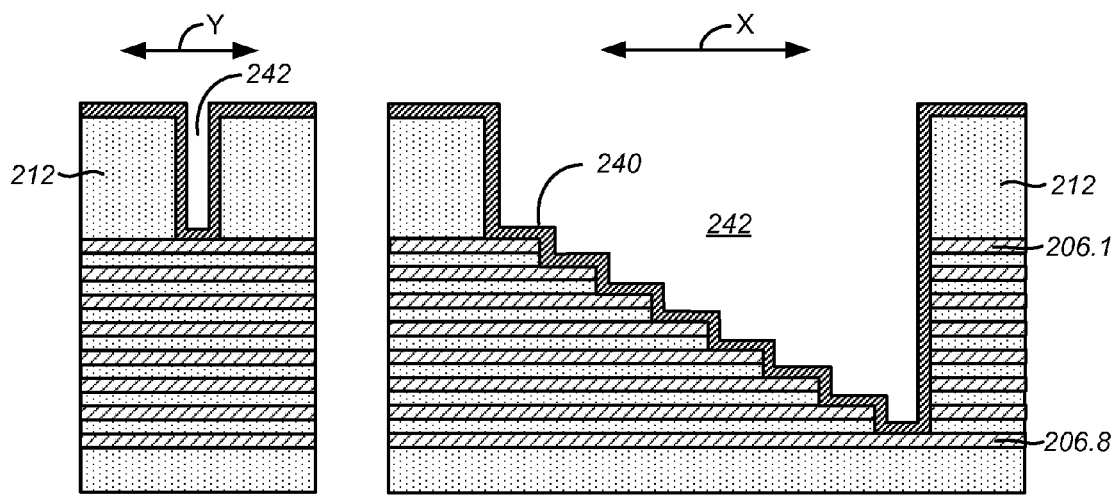
FIG. 12A                FIG. 12

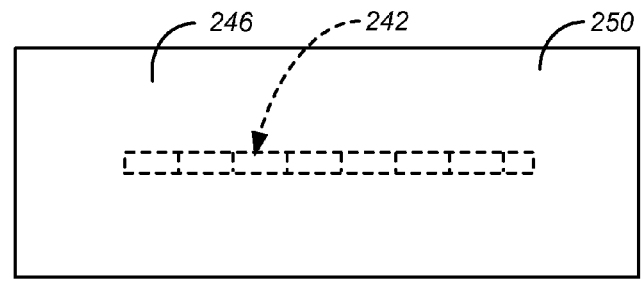
*FIG. 13B*
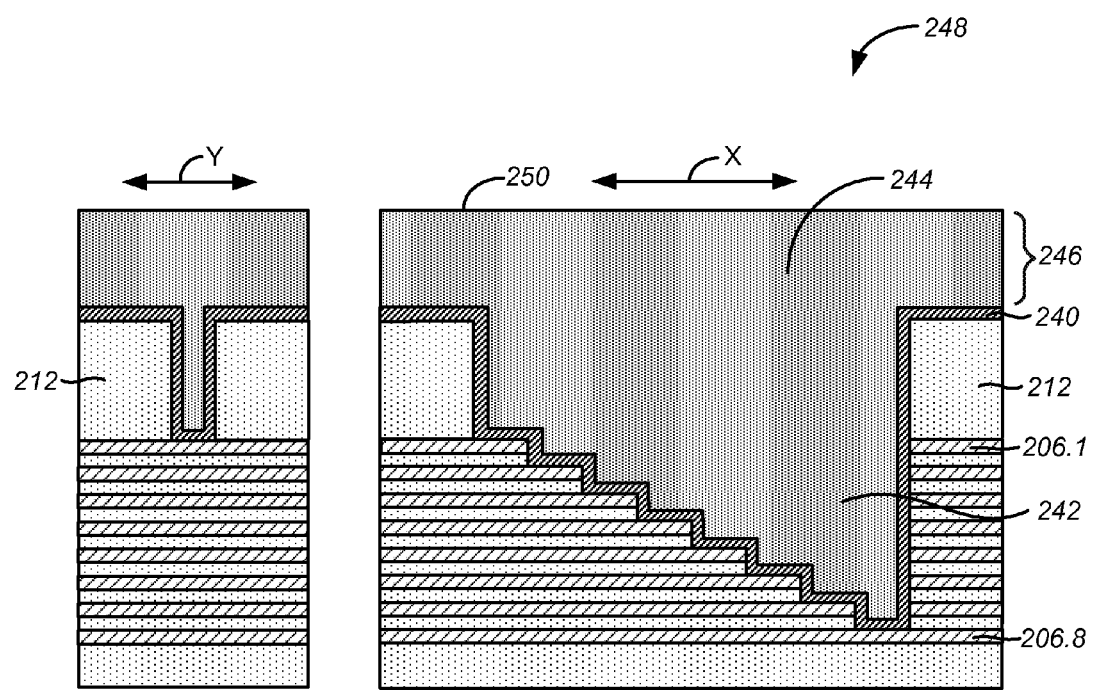
*FIG. 13A*  *FIG. 13*

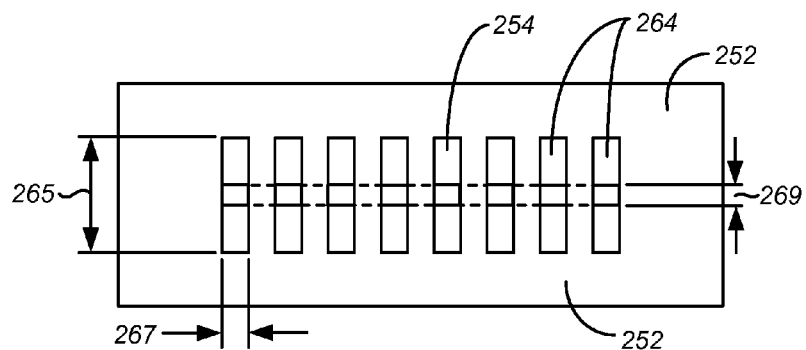
FIG. 15B
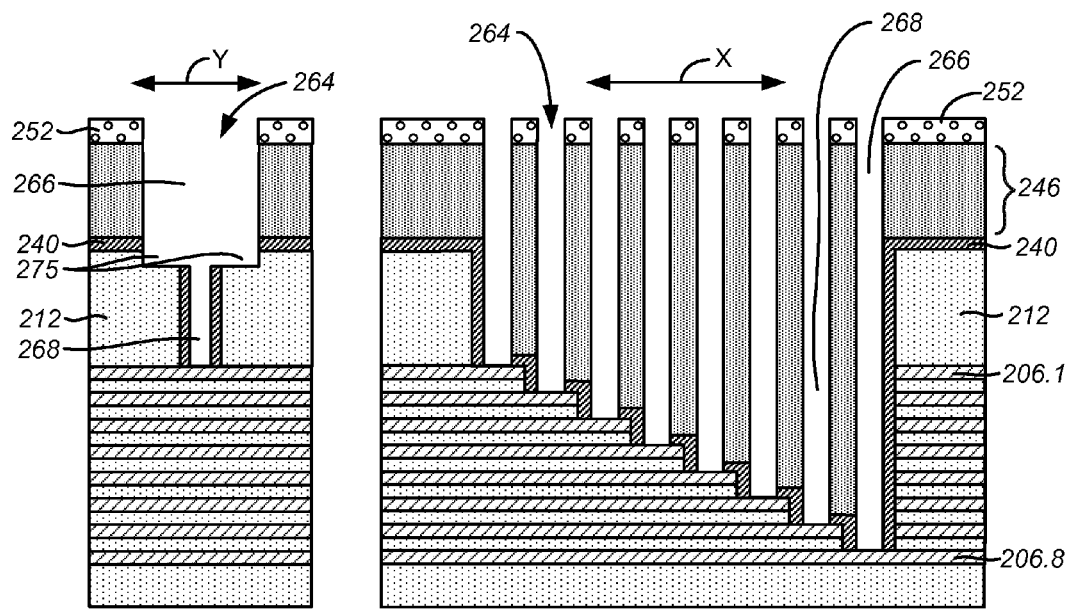
FIG. 15A  FIG. 15

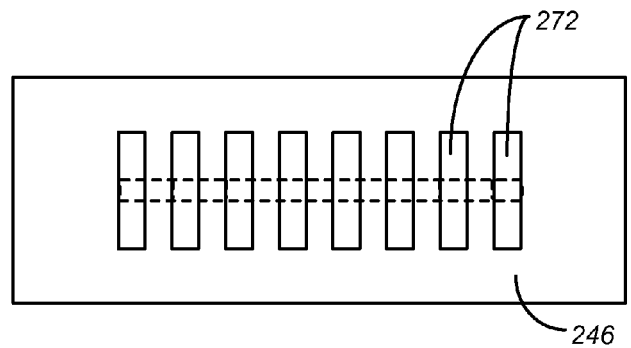
FIG. 16B
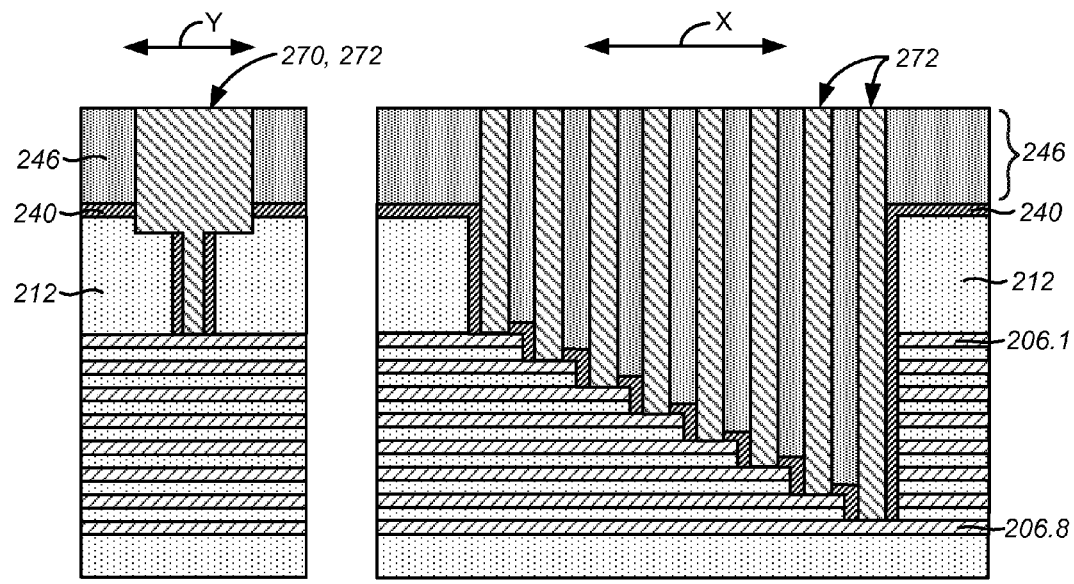
FIG. 16A   FIG. 16

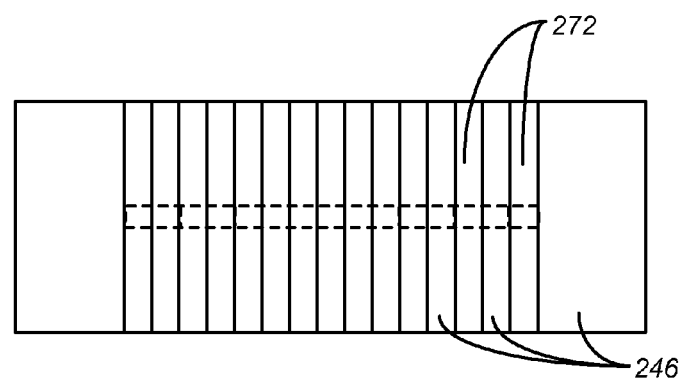
FIG. 18B
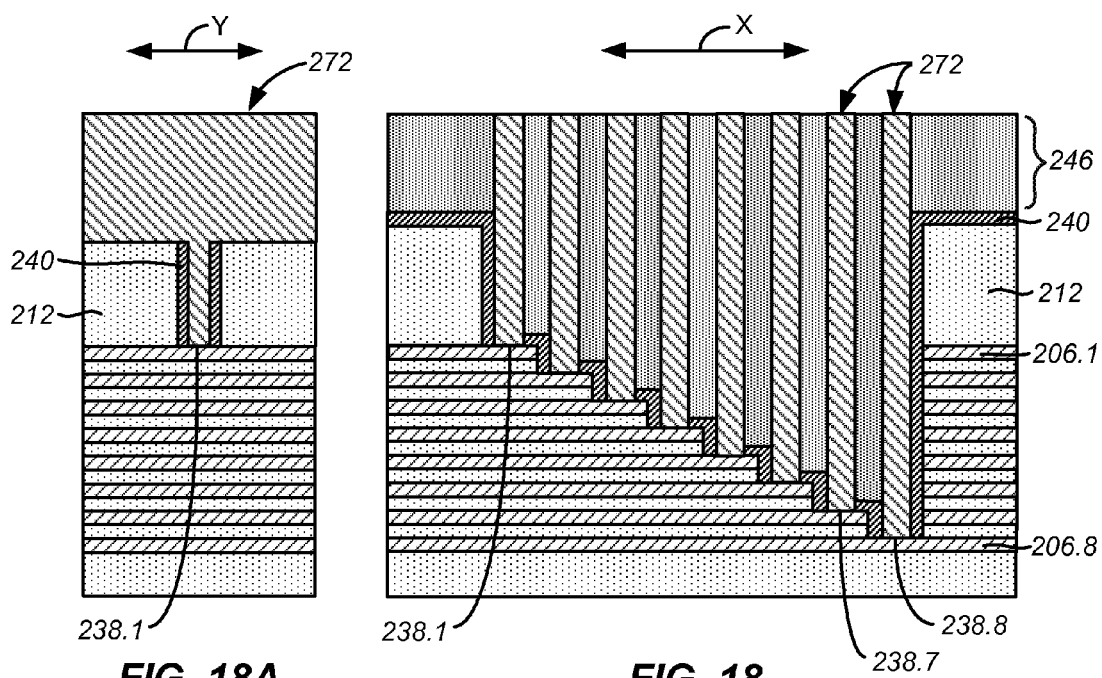
FIG. 18A   FIG. 18

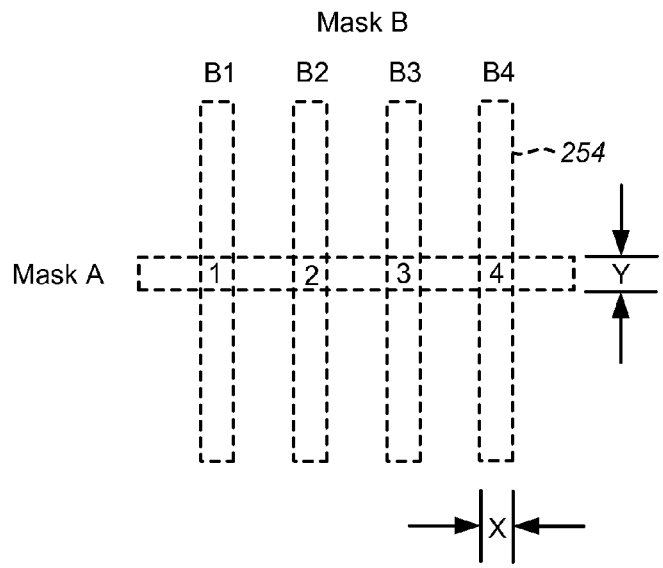
FIG. 24
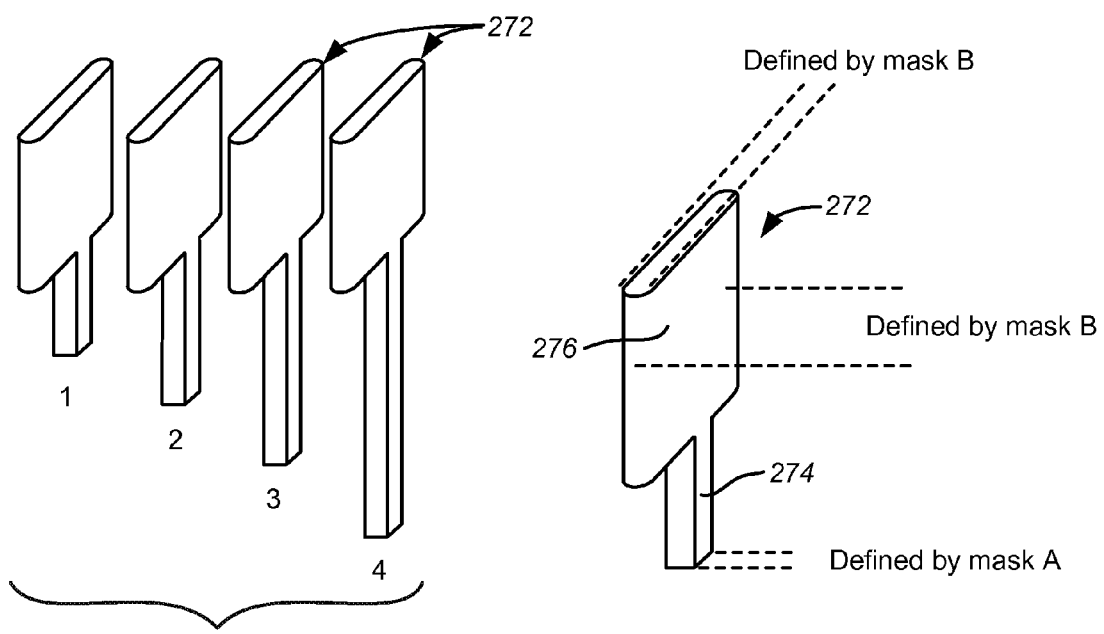
FIG. 25
FIG. 26

US 8,928,149 B2

INTERLAYER CONDUCTOR AND METHOD FOR FORMING

CROSS-REFERENCE TO RELATED APPLICATIONS

This application claims benefit of U.S. Provisional Patent Application No. 61/776,906, filed 12 Mar. 2013.

BACKGROUND

1. Field of the Invention

The present invention relates to three-dimensional (3-D) integrated circuits, and in particular to providing interlayer conductors to multiple planes of circuits in the devices.

2. Description of Related Art

3-D integrated circuits include multiple active layers in which conductive or semiconductive elements are disposed. 3-D memory integrated circuits include stacks of two-dimensional arrays of memory cells. Active layers in the stacks can include bit lines or word lines for example, which must be connected to peripheral circuits like decoders, sense amplifiers and the like. In some arrangements, the connections are made using interlayer conductors that extend from each active layer to a routing layer, such as a patterned metal layer that overlies the stacks of two-dimensional arrays. The patterned metal layer can be used to route signals and bias voltages between the arrays and the appropriate peripheral circuits. Similar signal routing structures can be used on other types of 3-D integrated circuits.

The interlayer conductors have lengths that vary in dependence on the active layer to which contact is made. Because of the varying lengths and other factors, techniques used to implement the interlayer conductors can involve multiple steps and require special processes. A variety of technologies that can be deployed for this purpose is described in co-pending and commonly owned patent applications, including U.S. patent application Ser. Nos. 13/049,303; 13/114,931; 13/240,058; 13/735,922; 13/736,104, each of which is incorporated by reference as if fully set forth herein.

As the number of active layers increases, some of the processes involved in formation of interlayer conductors can become more difficult. It is desirable, therefore, to provide technologies that support the formation of patterned conductors and interlayer conductors in 3-D integrated circuits as the number of active layers increases.

SUMMARY

A 3-D structure is described that includes a stack of active layers at different depths. A corresponding plurality of contact landing areas are disposed on respective active layers within a contact area opening. A plurality of interlayer conductors, each in some embodiments including a first portion within a contact area opening extending to a contact landing area, and a second portion in part outside the contact area opening above the top active layer. The first portion has a transverse dimension $Y_1$ that is nominally equal to the transverse dimension of the contact area opening, and the second portion having a transverse dimension $Y_2$ that is greater than the transverse dimension of the contact area opening. The active layers can be bit lines or word lines for a 3-D memory device, other active layers in integrated circuits, or more complex active layers, such as stacked chips in a multichip module.

A method for forming a device having contact landing areas at varying depths in a substrate, is described. The method in described embodiments can comprise forming a patterned, first mask layer (e.g. thick silicon oxide) on the substrate, including a contact area opening on the substrate. A second mask layer (e.g. spin coated ODL) is formed over the first mask layer, the second mask layer filling said contact area opening. Using a patterned, third mask layer (e.g. thin SHB) a starting via location can be formed within the contact area opening. Then in one described embodiment, the method comprises etching a via through the second mask layer at the starting via location, followed by forming contact landing areas at a plurality of depths in the substrate by iteratively etching an increment in depth into the substrate through the via, and trimming the second mask layer to enlarge the via.

Another method for forming a device having contact landing areas at varying depths in a substrate, is described which in some embodiments comprises forming contact landing areas at a plurality of depths in the substrate within a contact area opening in a first insulating layer, wherein the contact area opening has a longitudinal dimension and a transverse dimension. Then, an etch stop layer (e.g., silicon nitride) is formed over the contact landing areas on substrate, on sidewalls of the contact area opening, and on the overlying mask layer. A second insulating layer is then formed over the etch stop layer, the insulating layer filling the contact area opening. A plurality of interlayer conductor locations for corresponding contact landing areas in the contact area opening is defined, using for example a patterned conductor mask. The interlayer conductor locations have a transverse dimension that is greater than the transverse dimension of the contact area opening, and having a longitudinal dimension, that fits within the longitudinal pitch of the contact landing areas. The method in a described embodiment, includes etching through the second insulating layer at the interlayer conductor locations by using a process selective for the second insulating layer over the etch stop layer, and then etching openings in the etch stop layer exposing the contact landing areas at the plurality of depths to form interlayer conductor vias while leaving at least portions of the etch stop layer on the sidewalls. Then, interlayer conductor vias can be filled with a conductive material to form interlayer conductors.

Other aspects and advantages of the technology described herein can be seen on review of the drawings, the detailed description and the claims, which follow.

BRIEF DESCRIPTION OF THE DRAWINGS

FIGS. 2-17 illustrate an example of process steps for forming interlayer conductors at a contact area of a 3-D integrated circuit.

FIG. 2 is a cross-sectional view of a contact area of a 3-D integrated circuit illustrating a stack of alternating conductive and insulating layers covered by a first material.

FIGS. 2A and 2B are side cross-sectional and top plan views of the structure of FIG. 2.

FIGS. 3, 3A, 3B illustrate the structure of FIGS. 2-2B following the creation of a trench-like contact area opening within the first material.

FIGS. 4, 4A, 4B show the structure of FIGS. 3-3B following deposition of a second material.

FIGS. 5, 5A, 5B show the structure of FIGS. 4-4B after depositing a bottom layer and a first photoresist mask.

FIGS. 6, 6A, 6B illustrate the structure of FIGS. 5-5B with an opening in the bottom layer, followed by removal of the first photoresist mask.

FIGS. 7, 7A, 7B illustrate the structure of FIG. 6-6B after formation of an opening through the second material using the bottom layer to expose the top, first active layer.

FIGS. 8, 8A, 8B show the structure of FIG. 7-7B after etching through one active layer and one insulating layer to expose the second active layer.

FIGS. 9, 9A, 9B illustrate the structure of FIGS. 8-8B after the second material has been trimmed to create an enlarged opening.

FIGS. 10, 10A, 10B show the structure of FIGS. 9-9B after etching through one active layer and one insulating layer.

FIGS. 11, 11A, 11B show the structure of FIGS. 10-10B after a repeat of the trimming and etching steps of FIGS. 9-10B to create a preliminary second open region with a stairstep arrangement of landing areas.

FIGS. 12, 12A, 12B show the structure of FIGS. 11-11B after depositing a stopping layer.

FIGS. 13, 13A, 13B show the structure of FIGS. 12-12B after depositing an insulating material in and above the second open region.

FIGS. 14, 14A, 14B illustrate the structure of FIGS. 13-13B following the creation of a second photoresist mask having a series of transverse openings, with FIG. 14C being a three-dimensional view of the stopping layer of FIG. 14A.

FIGS. 15, 15A, 15B show the structure of FIGS. 14-14B after etching through the transverse openings down to the landing areas to create vias.

FIGS. 16, 16A, 16B show the structure of FIGS. 15-15B after depositing a conductive material within the vias to create interlayer conductors, FIG. 16C being similar to FIG. 16A and FIG. 16D being a three-dimensional view of the interlayer conductor and stopping layer of FIG. 16A.

FIG. 17 is an enlarged three-dimensional view of the interlayer conductor of FIG. 16D.

FIGS. 18, 18A, 18B, 18C show a similar structure to that of FIG. 16-16C but in which the transverse openings used with the second photoresist mask, not shown, are much longer than shown in FIG. 14B so that the upper portions of the interlayer conductors can have an extended length.

FIGS. 20 and 20A are cross-sectional and plan views similar to those of FIGS. 11 and 11B but with two trench-like second open regions, one on the right and one on the left, each exposing a stairstep arrangement of eight landing areas for the same eight active layers.

FIGS. 21 and 21A show the structure of FIGS. 20 and 20A after depositing a second material, a bottom layer, and a third photoresist mask having an opening overlying the left material-filled contact area opening.

FIGS. 22 and 22A illustrate the structure of FIGS. 21 and 21A following removal of the portion of the bottom layer beneath the mask opening, all of the second material within the left second open region, and of the third photoresist mask.

FIGS. 23, 23A illustrate the relative orientations of a mask A, used to create the trench-like contact area opening, and a mask B with a series of transverse openings.

FIG. 24 illustrate examples of the interlayer conductors created through the intersection of the openings in mask A and mask B of FIG. 23.

FIG. 25 shows one of the interlayer conductors of FIG. 24 identifying the dimensions of an interlayer conductor created through the use of mask A and mask B.

FIG. 26 is a schematic diagram of a 3D integrated circuit including a 3D NAND memory array.

DETAILED DESCRIPTION

Figure 1:
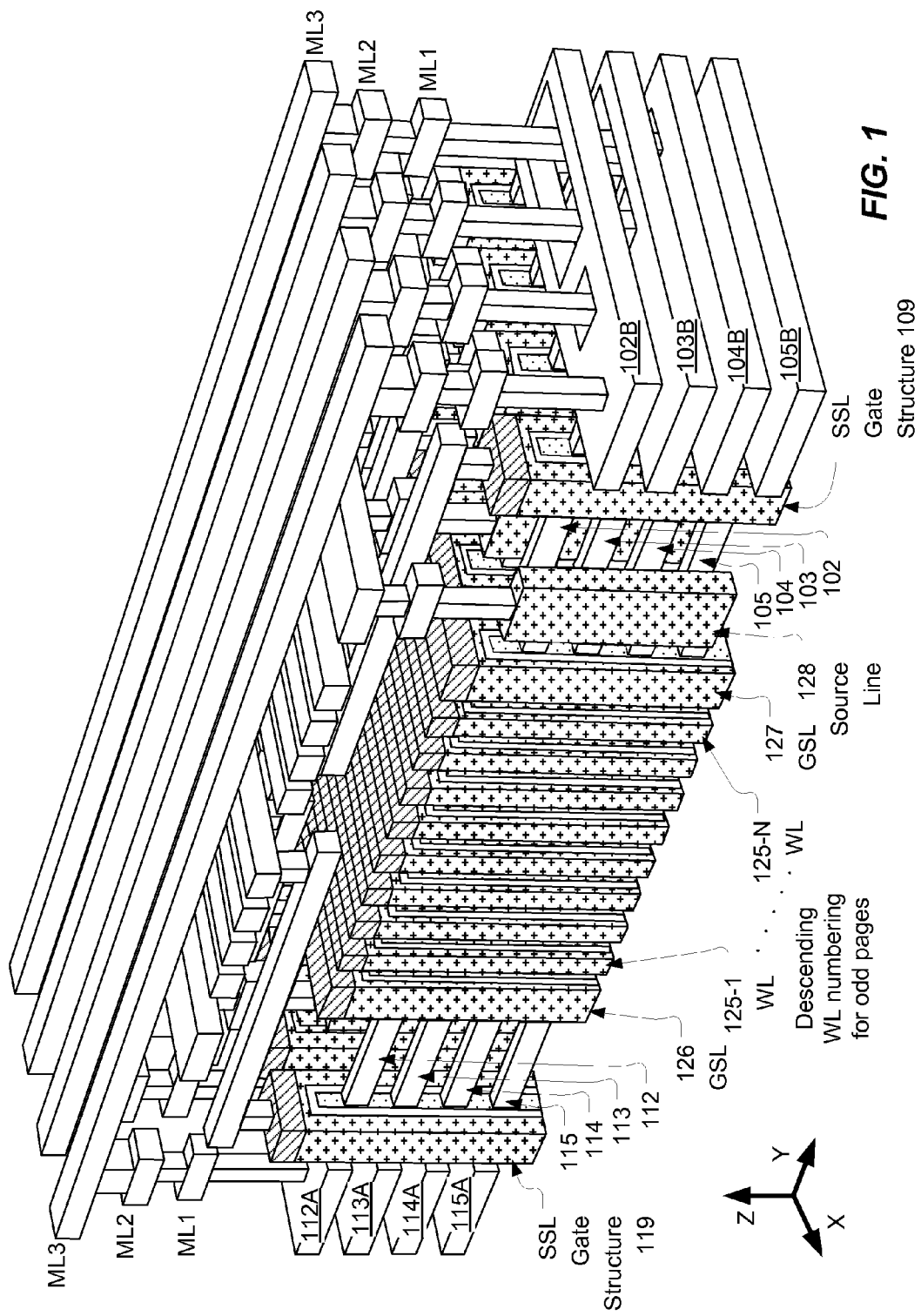
FIG. 1 is a perspective illustration of a 3D NAND memory array structure. Insulating material is removed from the drawing to expose additional structure for illustrative purposes.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals. Also, unless otherwise specified, the terms insulators and conductors refer to electrical insulators and electrical conductors.

FIG. 1 is a perspective illustration of a 3D NAND memory array structure. Insulating material is removed from the drawing to expose additional structure for illustrative purposes. For example, insulating layers are removed between the semiconductor strips (e.g. 112-115) in stacks, and are removed between the stacks of semiconductor strips.

The multilayer array is formed on an insulating layer, and includes a plurality of word lines 125-1 WL, . . . , 125-N WL conformal with the plurality of stacks. The plurality of stacks includes semiconductor strips 112, 113, 114, 115. Semiconductor strips in the same plane are electrically coupled to corresponding bit line pad structures (e.g. 102B to 105B and 112A to 115A).

The shown word line numbering, ascending from 1 to N going from the back to the front of the overall structure, applies to even memory pages. For odd memory pages, the word line numbering descends from N to 1 going from the back to the front of the overall structure.

Bit line pad structures 112A, 113A, 114A, 115A terminate semiconductor strips, such as semiconductor strips 112, 113, 114, 115, in each active layer of the structure. As illustrated, these bit line pad structures 112A, 113A, 114A, 115A are electrically connected to different global bit lines in overlying patterned conductor layer (M3) for connection to decoding circuitry to select planes within the array. These bit line pad structures 112A, 113A, 114A, 115A can be patterned at the same time that the plurality of stacks are defined.

Bit line pad structures 102B, 103B, 104B, 105B terminate semiconductor strips, such as semiconductor strips 102, 103, 104, 105. As illustrated, these bit line pad structures 102B, 103B, 104B, 105B are electrically connected to different global bit lines in overlying patterned conductor layer (ML3) for connection to decoding circuitry to select planes within the array, and sense amplifiers and other circuits. These bit line pad structures 102B, 103B, 104B, 105B can be patterned at the same time that the plurality of stacks are defined.

Any given stack of semiconductor strips is coupled to either the bit line pad structures 112A, 113A, 114A, 115A, or the bit line pad structures 102B, 103B, 104B, 105B, but not both. A stack of semiconductor strips has one of the two opposite orientations of bit line end-to-source line end orientation, or source line end-to-bit line end orientation. For example, the stack of semiconductor strips 112, 113, 114, 115 has bit line end-to-source line end orientation; and the stack of semiconductor strips 102, 103, 104, 105 has source line endto-bit line end orientation. In an alternative, all the strips in one active layer of the block can terminate in the same bit line pad structure.

The stack of semiconductor strips 112, 113, 114, 115 is terminated at one end by the bit line pad structures 112A, 113A, 114A, 115A, passes through SSL gate structure 119, ground select line GSL 126, word lines 125-1 WL through 125-N WL, ground select line GSL 127, and terminated at the other end by source line 128. The stack of semiconductor strips 112, 113, 114, 115 does not reach the bit line pad structures 102B, 103B, 104B, 105B.

The stack of semiconductor strips 102, 103, 104, 105 is terminated at one end by the bit line pad structures 102B, 103B, 104B, 105B, passes through SSL gate structure 109, ground select line GSL 127, word lines 125-N WL through 125-1 WL, ground select line GSL 126, and terminated at the other end by a source line (obscured by other parts of Fig.). The stack of semiconductor strips 102, 103, 104, 105 does not reach the bit line pad structures 112A, 113A, 114A, 115A.

A layer of memory material separates the word lines 125-1 WL through 125-N WL, from the semiconductor strips 112-115 and 102-105. Ground select lines GSL 126 and GSL 127 are conformal with the plurality of stacks, similar to the word lines.

Global bit lines and string select lines are formed in patterned conductor layers, such as the metal layers ML1, ML2, and ML3.

Transistors are formed at cross points between the semiconductor strips (e.g. 112-115) and the word line 125-1 WL through 125-N WL. In the transistors, the semiconductor strip (e.g. 113) acts as the channel region of the device. The semiconductor strips (e.g. 112-115) can act as the gate dielectric for the transistors.

String select structures (e.g. 119, 109) can be patterned during the same step that the word lines 125-1 WL through 125-N WL are defined. Transistors are formed at cross points between the semiconductor strips (e.g. 112-115) and the string select structures (e.g. 119, 109). These transistors act as string select switches coupled to decoding circuitry for selecting particular stacks in the array.

In an alternative, the active layer is patterned with word lines and the channels can be vertical between the stacks. See, for example, commonly owned U.S. Patent Application Publication No. 2012/0182808, filed 19 Jan. 2011, entitled Memory Device, Manufacturing Method And Operating Method Of The Same, by inventors Hang-Ting Lue and Shi-Hung Chen, which is incorporated by reference as if fully set forth herein.

The 3D memory device shown in FIG. 1 uses finger VG (vertical gates), like commonly owned U.S. Patent Publication No. 2012/0182806, filed Apr. 1, 2011, entitled Memory Architecture of 3D Array With Alternating Memory String Orientation and String Select Structures by inventors Shih-Hung Chen and Hang-Ting Lue.

Various techniques for the connection of interlayer conductors to landing areas on the bit line pad structures use a relatively thick hard mask in processing. One type of thick hard mask uses an organic dielectric layer, ODL, as the hard mask layer. However, to withstand processing from many layers the thickness for the ODL hard mask layer may need to b 2,000 nanometers or more. However, it can be difficult to manufacture such materials using typical spin on processes with thicknesses more that than about 400 nanometers, which may be only a fraction of the thickness needed. Thus multiple application processes may be needed to reach a desired thickness.

Another type of thick hard mask can be made of silicon nitride (SiN). However, stress considerations related to the thickness of SiN can limit its effective maximum thickness for this purpose.

FIGS. 2-17 illustrate an example of process steps for forming interlayer conductors at a contact area of a 3-D integrated circuit.

FIG. 2 is a simplified cross-sectional view of a portion of a region 202 of a 3-D integrated circuit illustrating a stack 204 of alternating semiconductive or active layers 206 and insulating layers 208 covered by a first insulating layer 210 of a first material 212 used as a first mask layer. Region 202 includes pad structures 102B, 103B, 104B, 105B or pad structures 112A, 113A, 114A, 115A when applied to the structure of FIG. 1.

The first insulating layer 210 acts as a hard mask and in some examples has a thickness of greater than 500 nm, while in some examples the thickness may be greater than 2 μm. The first material 212 used to form the first insulating layer can be an oxide such as silicon dioxide. Other materials, such as silicon nitrides, silicon oxynitrides, aluminum oxides and other high-K insulators, and so on, can also be used. The first insulating layer 210 may also be a multi-layer structure, such as silicon oxide/silicon nitride/silicon oxide (ONO), silicon oxide/high-K dielectric/silicon oxide (O/high-k/O). FIGS. 2A and 2B are side cross-sectional and top plan views of the region 202 on the multilayer substrate shown in FIG. 2, in which interlayer contacts are to be formed for perspective in the process steps described below.

Figure 3A:
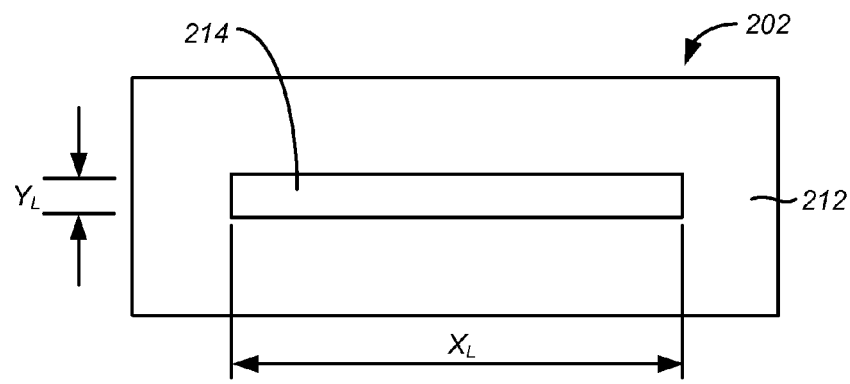
Figure 3:
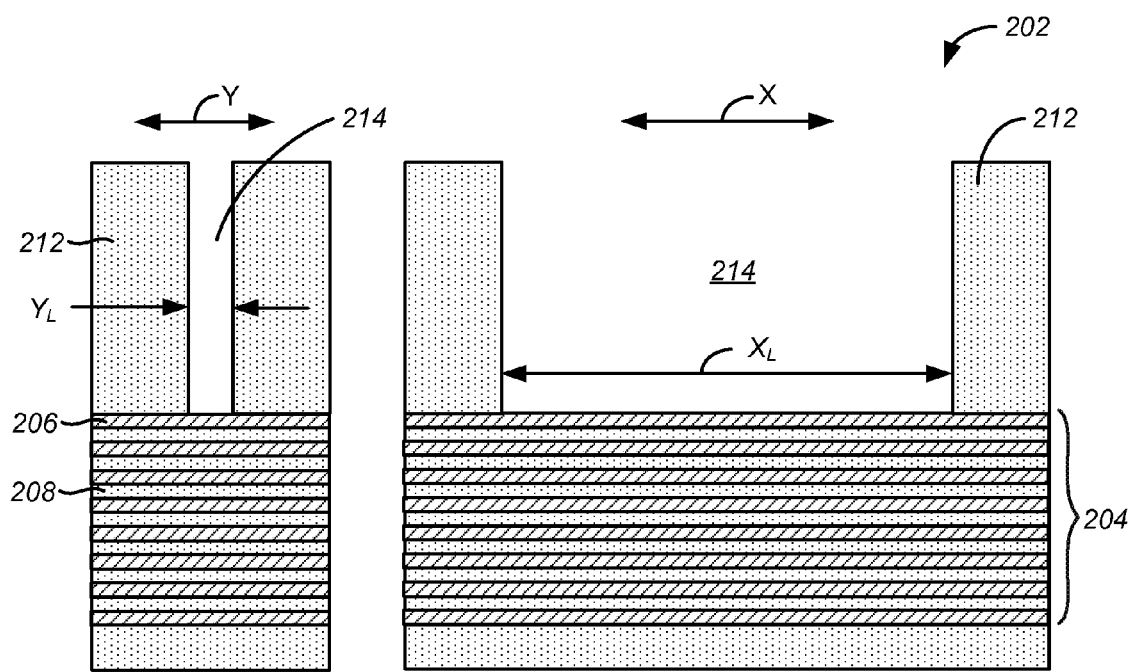

FIGS. 3, 3A, 3B illustrate the structure of FIGS. 2, 2A and 2B following the creation of a trench-like, contact area opening 214 within first insulating layer 210 above the stack 204 of active layers 206 and insulating layers 208. The opening 214 can be formed using a photoresist to define the shape, and then etching through the second insulating layer to the top layer of the multilayer stack. The contact area opening 214 has a longitudinal dimension $X_L$ in the X-direction (corresponding in the example of FIG. 1 with the direction of the word lines) and a transverse dimension $Y_L$ in the Y-direction (corresponding in the example of FIG. 1 with the direction of the semiconductor strips or bit lines). As illustrated, $Y_L$ is much greater than in the $X_L$ in embodiments of the process described herein.

FIGS. 4, 4A and 4B show the structure of FIGS. 3, 3A and 3B following deposition of a second layer 216, which is a different material than the first insulating layer 210, and fills into and above the contact area opening and above the first insulating layer 210 outside the contact area opening 214. In this example, second layer 216 also acts like a hard mask and can be an organic dielectric material such as polyimides, PTFE, dencocyclobutene, and polynorbornenes, typically deposited using spin on techniques. Also, carbon based films (amorphous or doped carbon films) such as used in so-called Advanced Patterning Film technology promoted by Applied Materials, can be used, and deposited using chemical vapor deposition for example. Other hard mask materials can be used as well. Second layer 216 has different etching properties so that the second material can be selectively etched. Within the etching properties constraints, other insulators, such as mentioned above relative to first material 212, can be used.

FIGS. 5, 5A and 5B show the structure of FIGS. 4, 4A and 4B after depositing a third mask layer 218, which can comprise a hard mask material such as a silicon rich bottom antireflective coating, known as SHB, over the second layer 216. Third mask layer 218 is patterned, such as using a first photoresist mask 220 as shown in FIGS. 5, 5A and 5B, and then etching, to define a starting via location 222 overlying one end 224 of the filled contact area opening 214.

In FIGS. 6, 6A and 6B, the structure of FIGS. 5, 5A and 5B is shown following the formation of the starting via location opening 226 in the third mask layer 218, using the opening 222 in the first photoresist mask 220. The first photoresist mask 220 is removed.

Figure 7B:
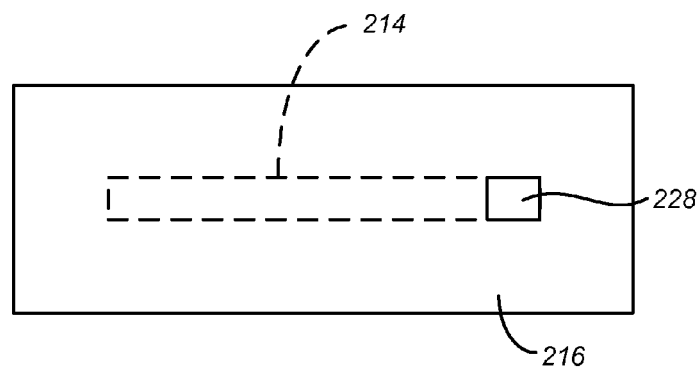
Figures 7, 7A:
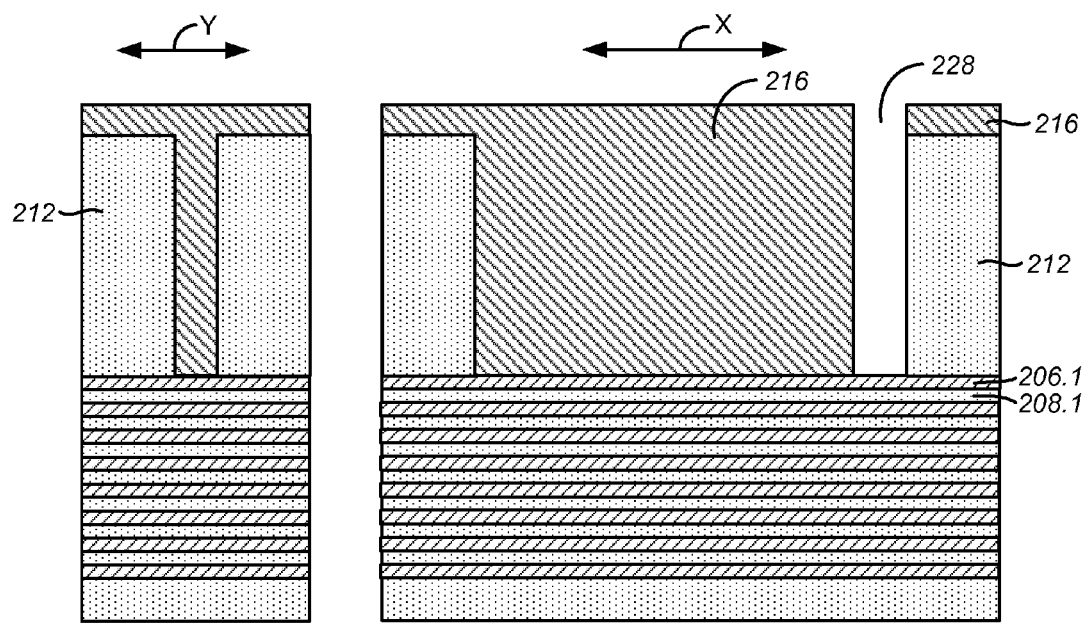

FIGS. 7, 7A and 7B illustrate the structure of FIGS. 6, 6A and 6B after formation of a via 228 through the second layer 216 using the starting via location opening 226 to pattern the second layer 216. Via 228 exposes the top active layer 206.1, or at least removes sufficient material over the top active layer 206.1 to support the following steps in the illustrated process.

FIGS. 8, 8A and 8B show the structure of FIGS. 7, 7A and 7B after a first iteration in process of forming contact landing areas at a plurality of depths in the substrate by iteratively etching an increment in depth into the substrate through the via, and trimming the second mask layer to enlarge the via. The last iteration in the process (as the explanation configures the iterations here as an etch followed by a trim) may not require a trimming step. In the example shown, the increment in depth of the etch is sufficient to etch through the first active layer 206.1 and the first insulating layer 208.1. This is achieved by etching through via 228 in the second layer 216. The result this first iteration is that the second active layer 206.2 becomes exposed at the bottom of extended opening 230. FIGS. 7 and 8 illustrate that the etching process used to etch through the via into the substrate removes a portion of the upper surface of second layer 216. The amount removed depends on the selection of materials and the etching process used. However, because in some embodiments, a large number of iterations can be performed, the amount removed can be significant for some chosen materials, such as an ODL as described above.

Figure 9B:
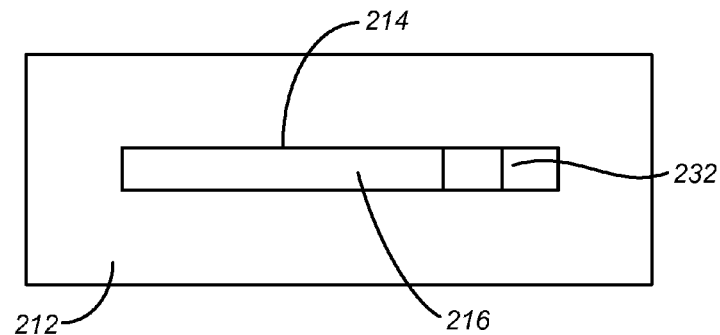
Figures 9, 9A:
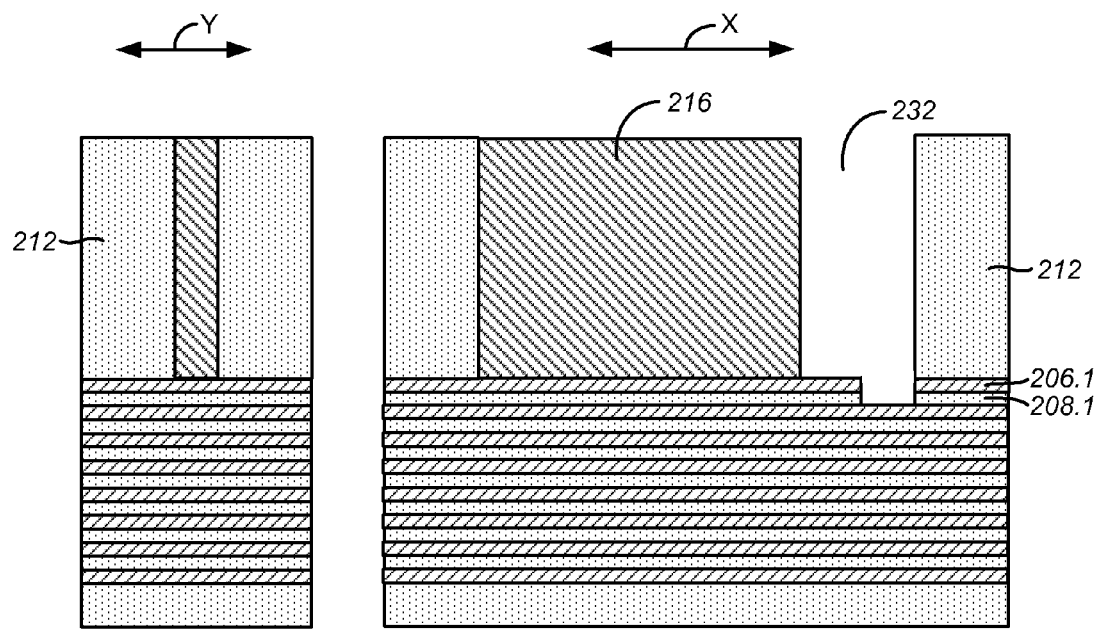

The result of trimming the second layer 216 is illustrated in FIGS. 9, 9A and 9B. The trimming can include using a selective anisotropic etch process that is selective for the second mask layer over the first mask layer, so that the first insulating layer 212 can remain substantially intact for the purposes of maintaining definition of the contact area opening. Doing so creates an enlarged via 232 down to the stack 204 to expose another portion of first active layer 206.1 as well as the portion of the substrate already etched. Following this trimming step, FIGS. 10, 10A and 10B show the structure of FIGS. 9, 9A and 9B after etching through another increment in depth in the substrate (one active layer and one insulating layer) to expose the second active layer 206.2 and the third active layer 206.3.

The etching and trimming iterations continue until the desired number of contact landing areas is formed at a plurality of depths in the substrate. FIGS. 11, 11A and 11B show the structure after such repeated etching and trimming iterations. During so creates a stairstep arrangement 236 in the open region 234 of landing areas 238 at a plurality of depths in the substrate, on the active layers 206 in this example. Each step in the stairstep arrangement provides a landing area 238-1 to 238-8 for an interlayer conductor. Sidewalls (e.g. 239) on the landing areas 238-1 to 238-8 in the illustrated structure, expose edges of active layers immediately above the respective landing areas.

FIGS. 12, 12A and 12B show the structure after depositing an etch stop layer 240 on the surfaces, including the landing areas and the sidewalls, defining the open region 234 to create a second open region 242. Etch stop layer 240 includes a material different than an insulating fill to be deposited over it as explained above, so that it can be utilized in a procedure that stops a vertical etch on the landing areas at the plurality of depths, and can act to align vias for interlayer conductors with the longitudinal sidewalls on the opposing sides of contact area opening. In one example of the etch stop layer 240 can be silicon nitride, for use with a silicon oxide based over-layer. Other materials such as hydrogenated silicon carbides (SiC (H)), hydrogenated silicon oxycarbides (SiOC (H)) can also be used.

FIGS. 13, 13A and 13B show the structure after depositing an insulating layer 244 in the second open region 242, filling the contact area opening and having a depth over the substrate outside the contact area opening. Insulating layer 244 includes portion 246 having a depth over first insulating layer 212, including above the second open region 242. Doing so creates a subassembly 248 having an upper surface 250. Insulating layer 244 can be silicon dioxide, other insulating materials as discussed above with regard to first layer 212, or other materials as suits a particular embodiment. The insulating layer 244 is different from the etch stop layer 240 for the purpose of etching selectivity, in embodiments utilizing the etch stop layer 240.

Figure 14C:
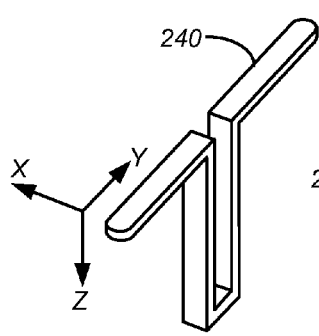
Figure 14B:
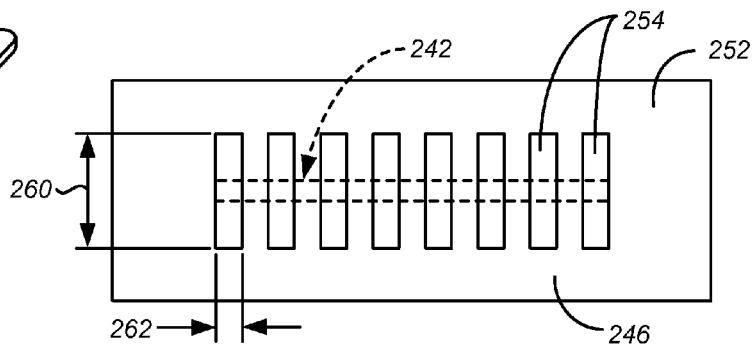
Figures 14, 14A:
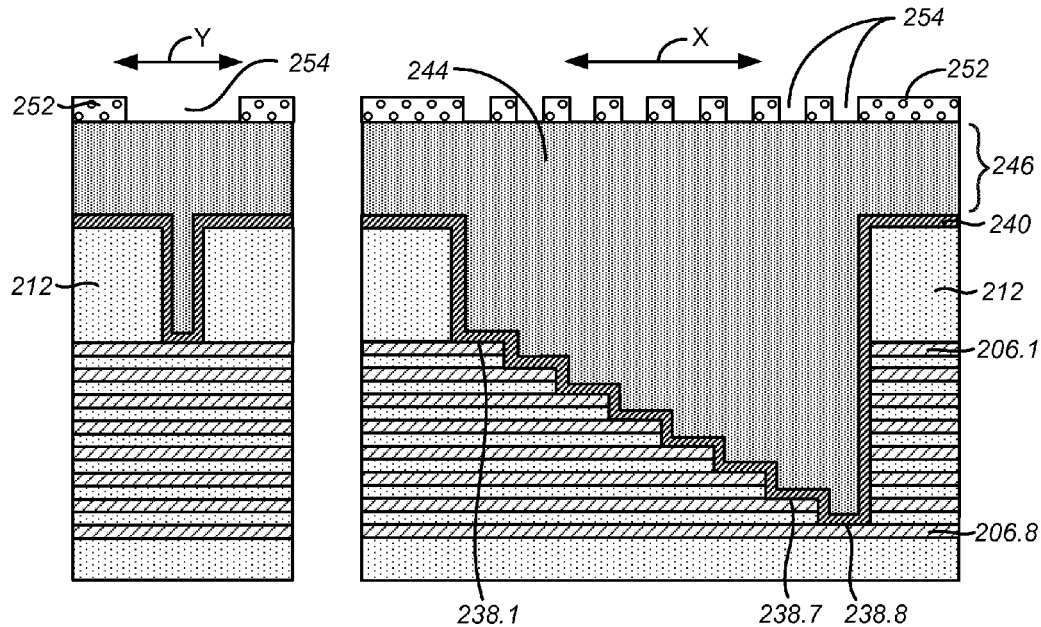

A patterned conductor mask 252 is created on upper surface 250 as shown in FIGS. 14, 14A and 14B using a photoresist for example. The patterned conductor mask 252 has a series of transverse openings 254 extending in the Y direction across the contact area opening, and aligned in the X direction with the landing areas 238-1 to 238-8. FIG. 14C is an enlarged three-dimensional view of a portion of the etch stop layer 240 within one of the mask openings 254, giving a perspective of the shape in the transverse direction.

Referring now also to FIGS. 3, 3A, 3B, contact area opening 214 is seen to have a first transverse dimension $Y_L$ (256) in the Y direction and a first longitudinal dimension $X_L$ (258) in the X direction. The longitudinal dimension $X_L$ is substantially longer than first transverse dimension $Y_L$. Transverse openings 254 in the patterned conductor mask shown in FIGS. 14, 14A and 14B have a second transverse dimension 260 in the Y direction and a second longitudinal dimension 262 in the X direction. Second longitudinal dimension 260 of the openings in the patterned conductor mask is substantially longer than the second transverse dimension 262. In addition, the second transverse dimension 260 in the patterned conductor mask is substantially longer than the first transverse dimension $Y_L$ (256) of the contact area opening.

In FIGS. 15, 15A and 15B, the structure is shown after etching through the transverse openings 254 in the patterned conductor mask 252 at interlayer conductor locations to the contact landing areas at the plurality of depths to form interlayer conductor vias. The etching process etches through the insulating material 244, and utilizing the etch stop layer 240 stops at the contact landing areas 238 of the active layers 206. Doing so creates interlayer conductor vias 264, the vias each having a first portion 268 within the contact area opening through the first insulating layer 212 and extending to a corresponding one of said contact landing areas, and a second portion 266 above the first insulating layer 212. The etch stop layer on the sidewalls that extend in the transverse direction at the landing areas provide for isolation between interlayer conductors in the contact area opening, and on the sidewalls on the contact area opening that extend in the longitudinal dimension assist in vertical alignment of interlayer conductor vias so that there may be less taper in the transverse dimension. Also the etch stop layer provides for self-alignment of the vias for the first portions 268 of the interlayer conductors with the contact area opening, as narrowed by the spacers formed by the etch stop layer, so that the patterned conductor mask can be used without an additional alignment step to form the first portions within the contact area opening.

Figure 16C:
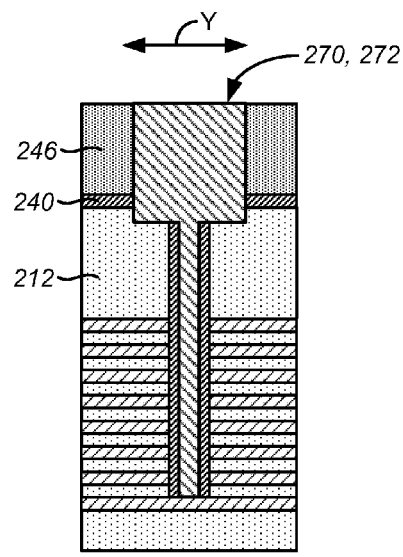
Figure 16D:
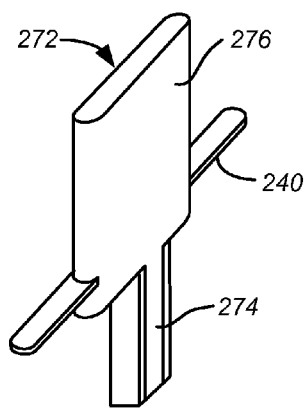

After formation of vias 264, a conductive material 270, see FIGS. 16A and 16C, is deposited in the vias 264 to create interlayer conductors 272. FIGS. 16A and 16C are similar but the show interlayer conductors 272 at the opposite ends of the series of interlayer conductors. FIG. 16D is an enlarged three-dimensional view of the interlayer conductor 272 and stopping layer 240 of FIG. 16A. Interlayer conductors 272 have an elongate lower first portion 274 and an enlarged upper second portion 276, the upper portion being enlarged in the transverse direction relative to the lower portion. In this example conductive material 270 is doped polysilicon (using dopants such as As, P), but, for example, materials such as a metal or combination of metals, including Al, Cu, W, Ti, Co, Ni, can also be used. The conductive material 270 can also be metal compounds, such as metal nitrides, or semiconductor compounds, such as silicides including WSi, TiSi, CoSi.

FIG. 15A shows that at the result of etching vias 264, portions of stopping layer 240 and a first material 212 at the upper ends of lower via portions 268 are etched away as indicated at regions 275. As shown in FIGS. 16A, 16C and 16D, parts of lower portions 276 of interlayer conductors 272 are formed within these etched away regions 275. As shown in FIG. 15B, upper portion 266 has a transverse dimension 265, upper and lower portions 266 and 268 have the nominally equal longitudinal dimension 267 (nominally equal means here that the dimensions would be equal but for manufacturing processes used to form them may result in variations, such as a taper.) Also lower portion 268 has a transverse dimension 269. The transverse dimension 265 of the upper portion is substantially greater than the transverse dimension 269 of the lower portion, and also substantially greater than longitudinal dimensions 267 of the upper portion and the lower portion.

Therefore, the contact landing areas have longitudinal pitches (e.g. sum of flat landing area and sidewall spacer formed by the etch stop layer), and the contact area opening has a longitudinal dimension $X_L$ and a transverse dimension $Y_L$, where $X_L$ is equal to or greater than a sum of the longitudinal pitches of the contact landing areas, and $Y_L$ is less than $X_L$. The interlayer conductors have longitudinal pitches (e.g. sum of longitudinal dimension of the interlayer conductor and the space between adjacent interlayer conductors), and each interlayer conductor has a longitudinal dimension $X_V$ and a transverse dimension $Y_V$, where $X_V$ is less than the average longitudinal pitch of the interlayer conductors, $X_V$ is less than $Y_V$, and $Y_V$ is greater than $Y_L$.

Figure 17:
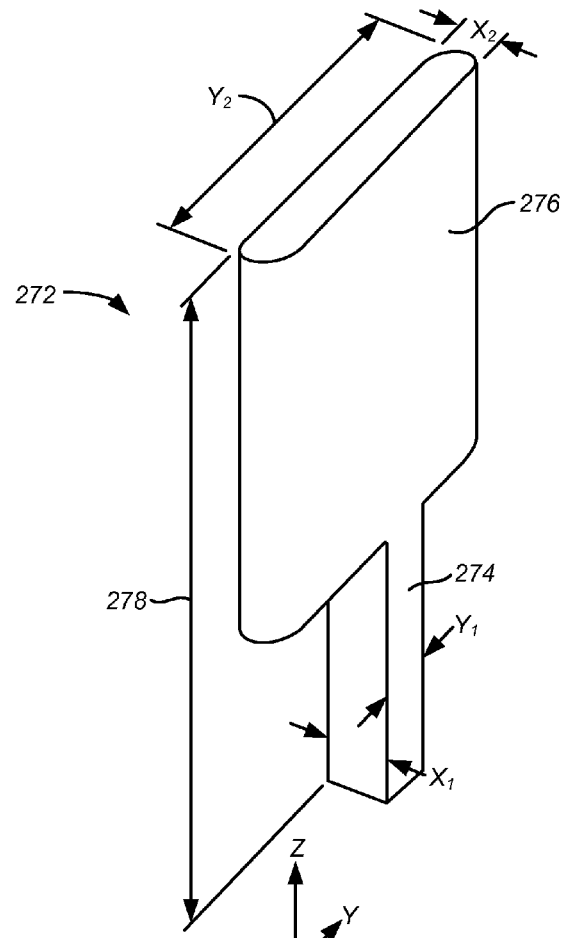

FIG. 17 is an enlarged three-dimensional view of the interlayer conductor 272 of FIG. 16D. The body of interlayer conductor 272 has a height 278 in the Z direction. The interlayer conductors have a first portion within the contact area opening below the first mask layer, and a second portion in the first mask layer in part outside the contact area opening, the first portion having a first longitudinal dimension $X_1$ and a first transverse dimension $Y_1$, and the second portion having a second longitudinal dimension $X_2$ and a second transverse dimension $Y_2$, wherein $X_1$ is less than the longitudinal pitch of a corresponding landing area for the interlayer conductor, $Y_1$ is nominally equal to $Y_L$, and $Y_2$ is greater than $Y_L$. The relaxed transverse dimension of the upper portion can facilitate layout of overlying interlayer conductors, for connection to patterned metal layers, like layer ML3 of FIG. 1.

Figure 18C:
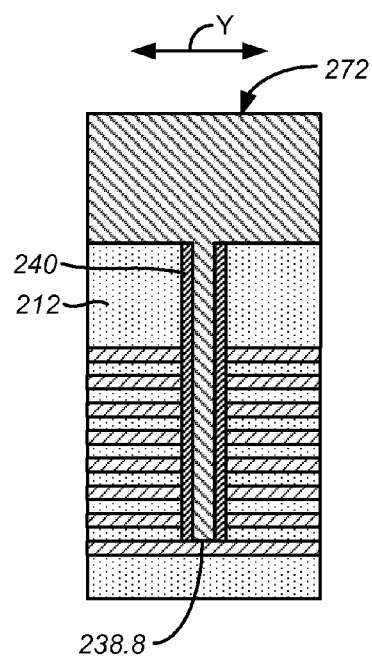

FIGS. 18, 18A and 18C show a similar structure to that of FIGS. 16, 16A and 16C but in which the patterned conductor mask extends the openings 254 an shown in FIG. 14B to form longer patterned conductor lines 276 which can connect to other elements of the integrated circuit in areas outside of the contact area, while the lower portions 274 act as contacts to the plurality of underlying layers. For example, the upper portions can be utilized as global bit lines in place of the extra ML3 layer as shown in FIG. 1.

Figure 19:
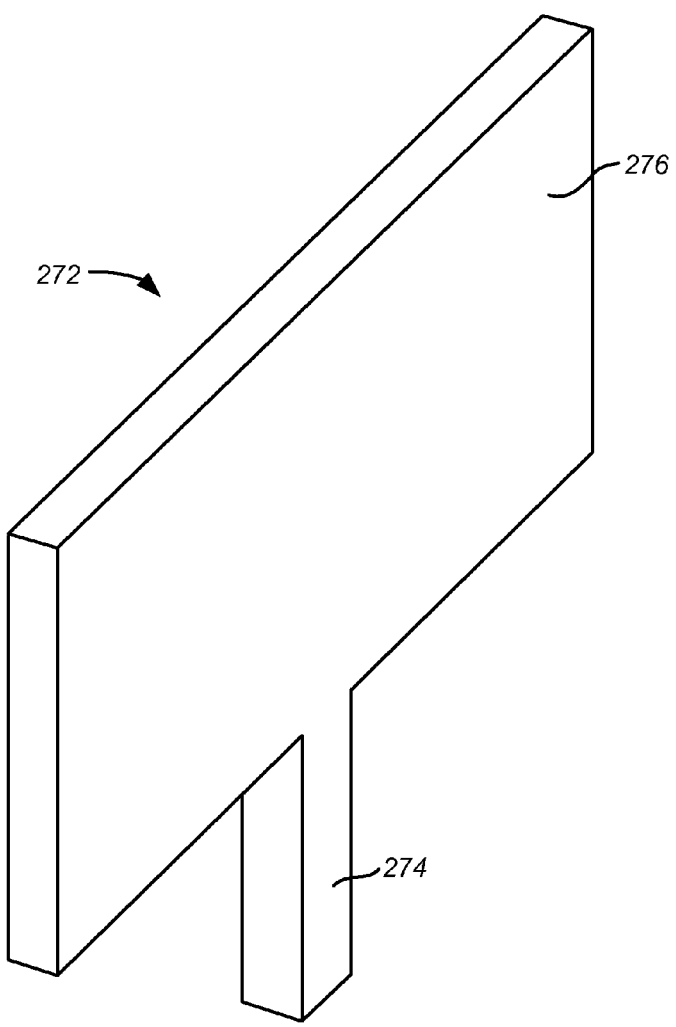
FIG. 19 is an enlarged three-dimensional view of the interlayer conductor shown in FIG. 18A.

FIG. 19 is an enlarged three-dimensional view of the interlayer conductor 272 shown in FIG. 18A.

FIGS. 20-23A show a process by which multiple trench-like second open regions 242 are used to enable connection to more active layers 206 in the same block of landing areas.

Figure 20A:
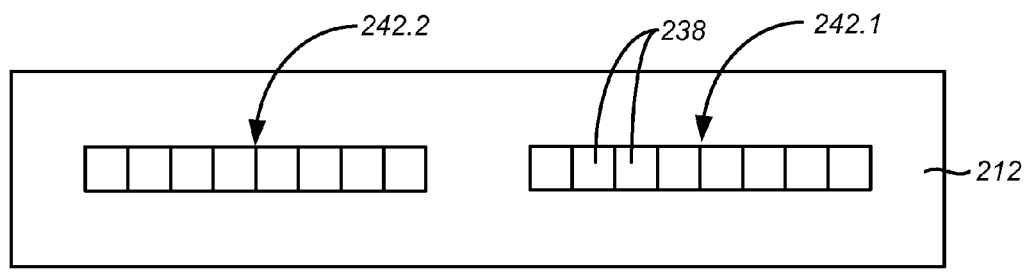
Figure 20:
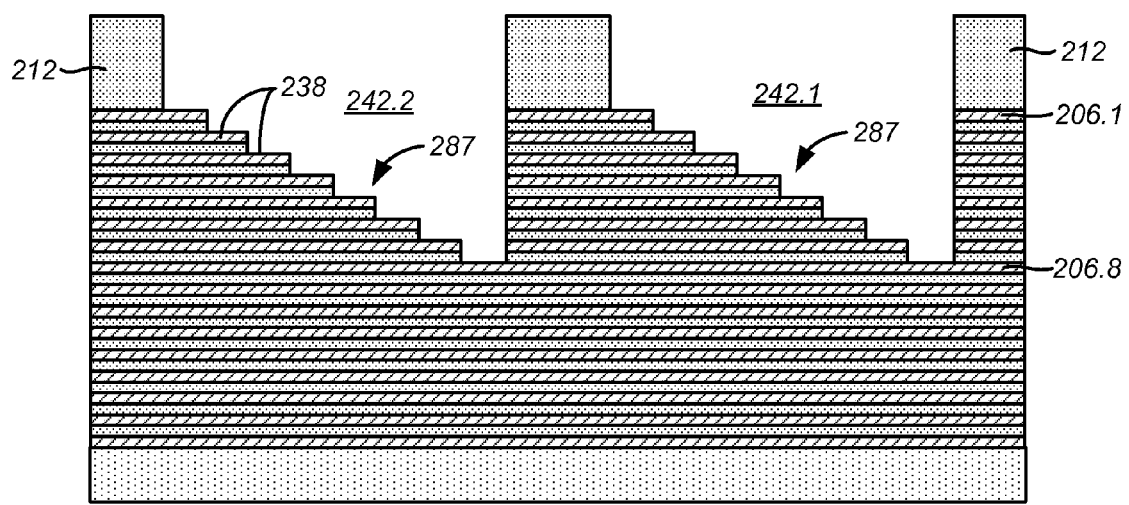
FIGS. 20-23A show a process by which multiple trench-like contact area openings are used to enable connection to more active layers.

FIGS. 20 and 20A are cross-sectional and plan views similar to those of FIGS. 11 and 11B but with two trench-like second open regions 242.1 and 242.2. Each of the second open regions 242.1 and 242.2 expose a stairstep arrangement 287 of eight landing areas 238 for the same eight active layers 206.1-206.8.

Figure 21A:
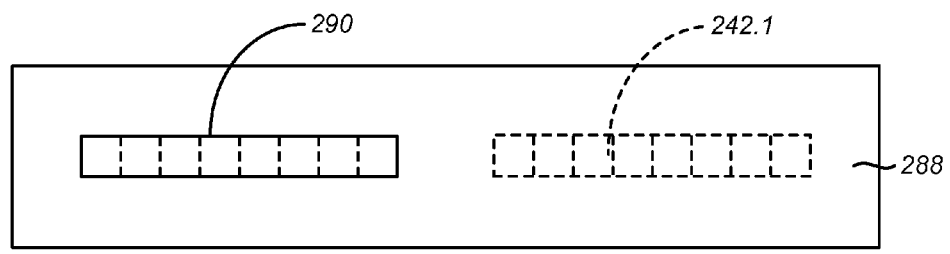
Figure 21:
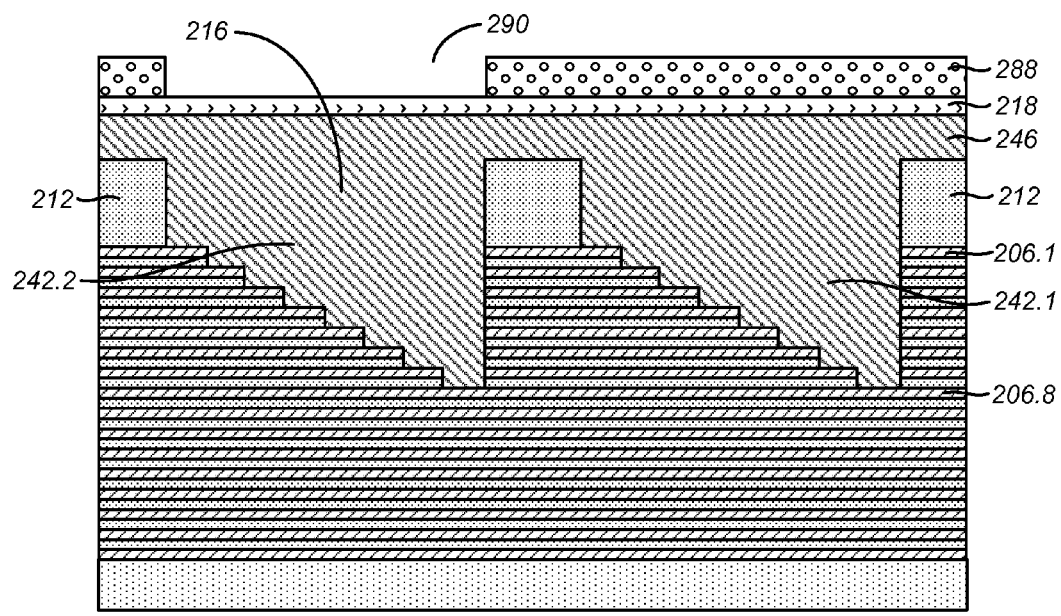

FIGS. 21 and 21A show the structure of FIGS. 20 and 20A after depositing the second material 216 in and above the second open regions 242.1 and 242.2. This is followed by depositing a mask layer 218 which, as discussed above, can be a SHB. A third photoresist mask 288 is formed on mask layer 218. Third photoresist mask 288 has an opening 290 overlying the left hand, material-filled second open region 242.2.

Figure 22A:
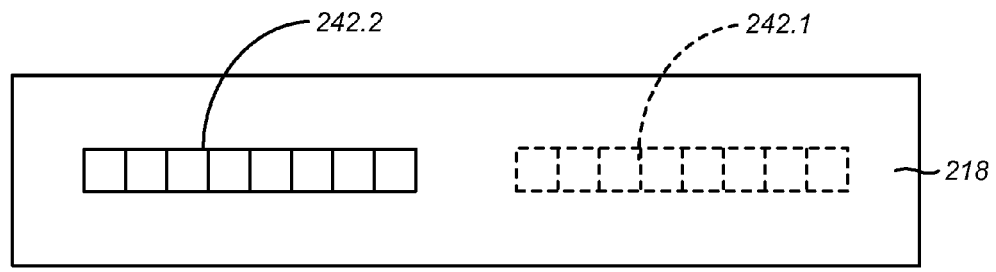
Figure 22:
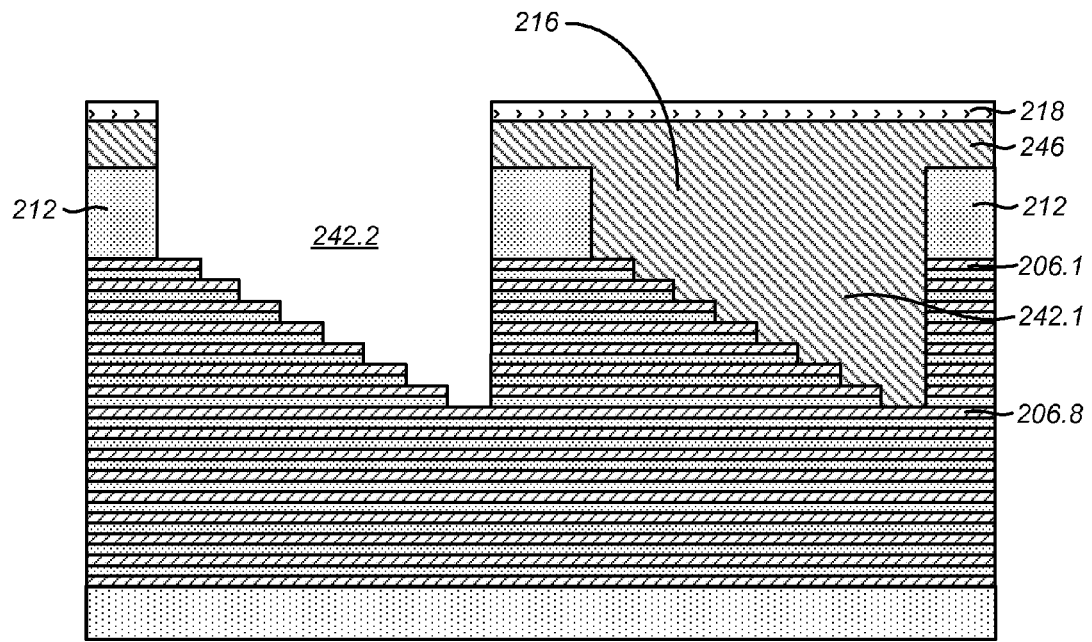

The structure of FIGS. 21, 21A is etched, see FIGS. 22 and 22A, causing the removal of the portion of the mask layer 218 beneath the opening 290 in the third photoresist mask 288 and the removal of all of the second layer 216 within the left hand, second open region 242.2. The third photoresist mask 288 is also removed.

Figure 23A:
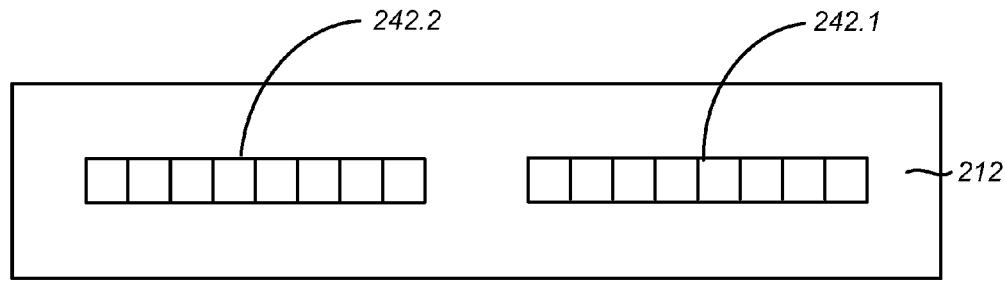
Figure 23:
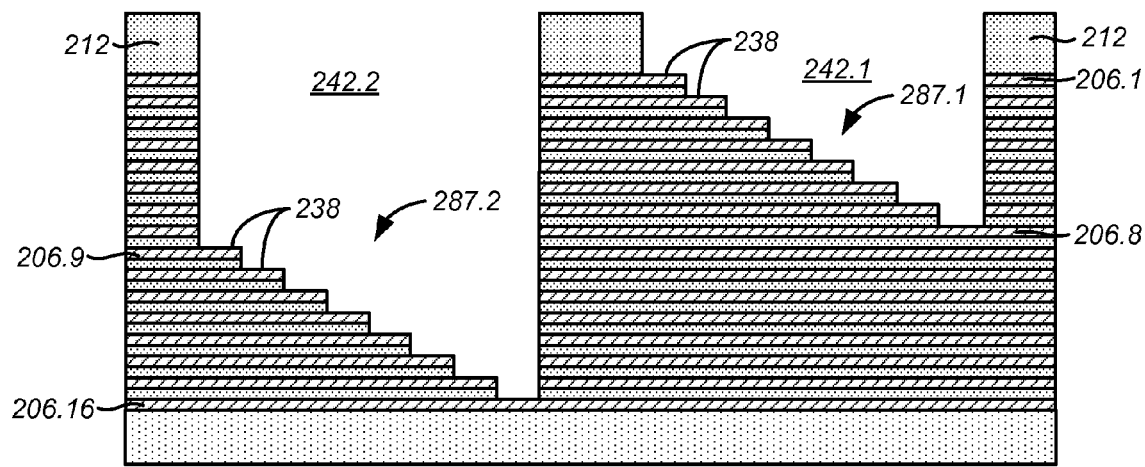

FIGS. 23 and 23A illustrate the result of etching eight active layers within the opening 242-2, with consequent removal of the layer 218 and portions 246 of the layer 212 over the top active layer. As a result, the landing areas 238 at the ninth through $16^{th}$ active layers 206.9-206.16. The remaining second material 216 in the right hand, second open region 242.1 is also removed. Resulting structure has stairstep arrangements 287.1 and 287.2 of landing areas 238 at second open regions 242.1 and 242.2. The further processing steps used to create interlayer conductors 272 can proceed as described with reference to FIGS. 12-16.

FIG. 24 illustrates the orientation of an opening in a mask A, not shown, used to create the trench-like contact area opening 214 relative to the orientation of the transverse openings 254 in the second photoresist mask 252, identified as mask B, used to define the upper portions of the interlayer conductors.

FIG. 25 illustrates examples of the interlayer conductors 272 created through the intersection of the openings in mask A and mask B of FIG. 24 and the etching/trimming steps discussed above. The interlayer conductors 272 correspond generally to the four leftmost interlayer conductors 272 of FIG. 16.

One of the interlayer conductors of FIG. 25 is shown in FIG. 26 identifying the dimensions defined by mask A and mask B. It can be seen that the dimension in the longitudinal direction of both lower portion 274 and upper portion 276 of interlayer conductor 272 is defined by mask B while the dimension in the transverse direction of lower portion 274 is defined by mask A and the dimension in the transverse direction of upper portion 276 is defined by mask B.

Figure 27:
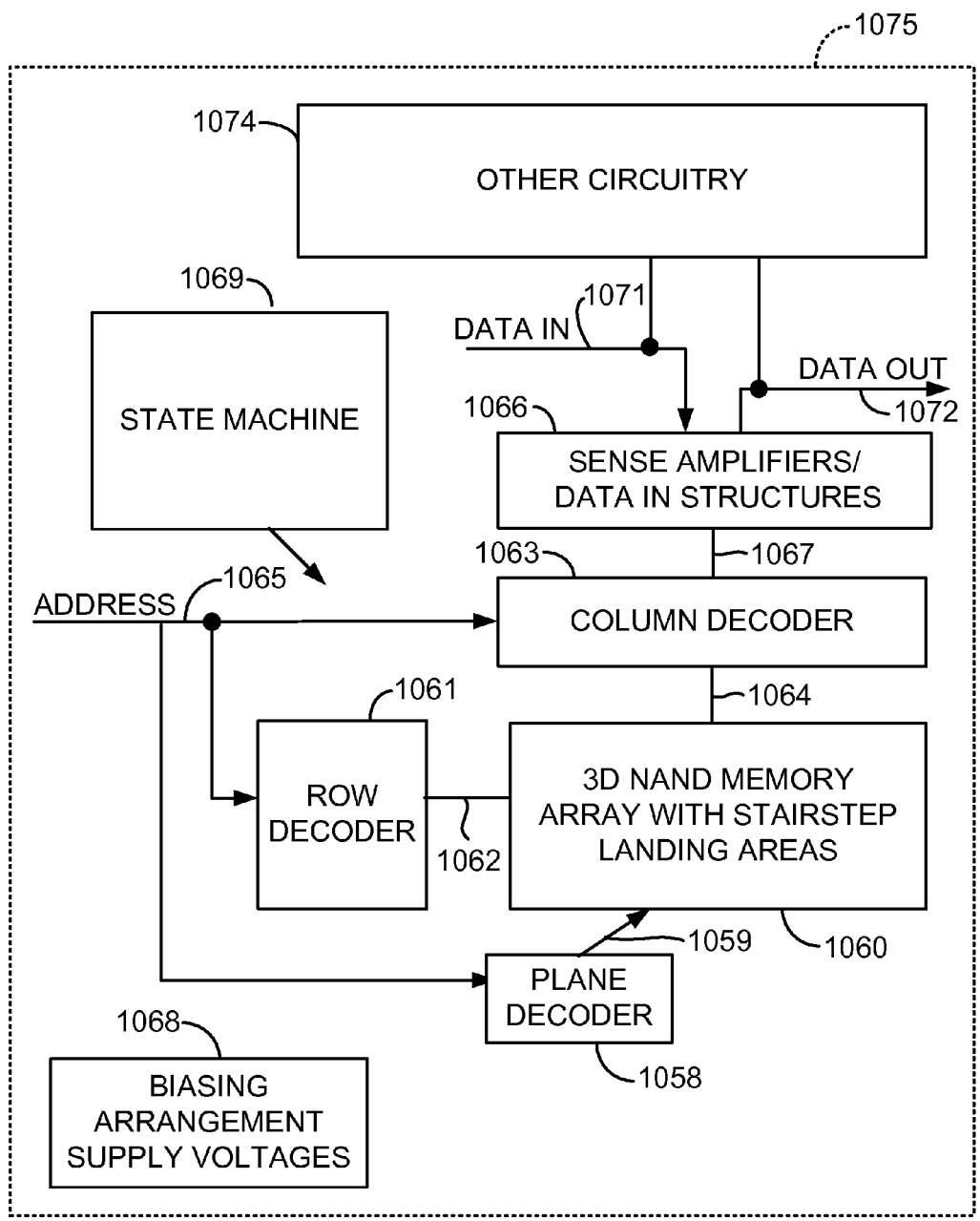
FIG. 27 is a schematic diagram of a 3-D integrated circuit including a 3D NAND memory array.

FIG. 27 is a schematic diagram of a 3-D integrated circuit including a 3D NAND memory array. The integrated circuit 1075 includes a 3D NAND flash memory array on a semiconductor substrate. The substrate includes a contact area 202 with a stack 204 of alternating active layers 206 and insulating layers 208 at the contact area 202. A row decoder 1061 is coupled to a plurality of word lines 1062, and arranged along rows in the memory array 1060. A column decoder 1063 is coupled to a plurality of SSL lines 1064, including string select structures, arranged along columns corresponding to stacks in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated embodiment, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Interlayer conductors as described herein can be utilized to contact active layers of a variety of types, including layers of chips as in the case of through silicon vias, layers of a multi-layer capacitor, such as described on my co-pending U.S. patent application Ser. No. 13/451,428, which is incorporated by reference as if fully set forth herein, in multichip packaging and in other multilayer structures.

The above descriptions may have used terms such as above, below, top, bottom, over, under, et cetera. These terms may be used in the description and claims to aid understanding of the invention and not used in a limiting sense. Any and all patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A 3-D structure, comprising:
    a stack including a plurality of active layers at a corresponding plurality of depths in the stack, including a top active layer, and a plurality of contact landing areas on respective active layers;
    a first insulating layer over the top active layer, and having a contact area opening over the plurality of contact landing areas, the contact area opening having a longitudinal dimension and a transverse dimension;
    a second insulating layer over the first insulating layer, and filling the contact area opening and having a depth over the first insulating layer;
    a plurality of interlayer conductors in the second insulating layer, the interlayer connectors having a first portion within the contact area opening through the first insulating layer and extending to a corresponding one of said contact landing areas, and a second portion in part outside the contact area opening above the first insulating layer,
    said first portion having a transverse dimension $Y_1$ that is nominally equal to the transverse dimension of the contact area opening, and
    said second portion having a transverse dimension $Y_2$ that is greater than the transverse dimension of the contact area opening.

2. The 3-D structure of claim 1, including a layer of material different than second insulating layer, between on sidewalls of the active layers in the plurality of contact landing areas.

3. The 3-D structure of claim 1, wherein the contact landing areas have longitudinal pitches (e.g. sum of flat landing area and sidewall structure), and the contact area opening has a longitudinal dimension $X_L$ and a transverse dimension $Y_L$, where $X_L$ is equal to or greater than a sum of the longitudinal pitches of the contact landing areas, and $Y_L$ is less than $X_L$; and
    each interlayer conductor has a longitudinal dimension $X_V$, where $X_V$ is less than the average longitudinal pitch of the contact landing areas, $X_V$ is less than $Y_2$, and $Y_2$ is greater than $Y_L$.

4. The 3-D structure of claim 1, wherein the contact landing areas have longitudinal pitches (e.g. sum of flat landing area and sidewall structure), and the contact area opening has a longitudinal dimension $X_L$ and a transverse dimension $Y_L$, where $X_L$ is equal to or greater than a sum of the longitudinal pitches of the contact landing areas, and $Y_L$ is less than $X_L$.

5. The 3-D structure of claim 1, wherein the first portion has a first longitudinal dimension $X_1$ and the second portion has a second longitudinal dimension $X_2$, and the first longitudinal dimension $X_1$ and the second longitudinal dimension $X_2$ are nominally equal.

6. The 3-D structure of claim 1, including a patterned conductor layer over the second portions of the plurality of interlayer conductors, and interlayer contacts between said second portions and the patterned conductor layer, at least some of said interlayer contacts being disposed over the contact area opening.

7. The 3-D structure of claim 1, wherein said second portions of the plurality of interlayer conductors comprise patterned conductor lines having interlayer contacts to other elements outside of the contact area opening.

8. The 3-D structure of claim 1, wherein said plurality of active layers comprise capacitor plates.

9. The 3-D structure of claim 1, wherein said plurality of active layers comprise integrated circuits in a multichip package.

* * * * *